(12) United States Patent
Yu et al.

(10) Patent No.: US 11,031,068 B2
(45) Date of Patent: Jun. 8, 2021

(54) MEMORY DEVICE RECEIVING DATA CLOCK SIGNALS AND OPERATION METHOD THEREOF

(71) Applicant: SAMSUNG ELECTRONICS CO., LTD., Suwon-si (KR)

(72) Inventors: Seongheon Yu, Suwon-si (KR); Joungyeal Kim, Yongin-si (KR); Doowon Bong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/834,090

(22) Filed: Mar. 30, 2020

(65) Prior Publication Data

US 2021/0043242 A1 Feb. 11, 2021

(30) Foreign Application Priority Data

Aug. 5, 2019 (KR) .................. 10-2019-0095177

(51) Int. Cl.
*G11C 11/40* (2006.01)
*G11C 11/4076* (2006.01)
*G06F 1/12* (2006.01)
*G11C 11/4072* (2006.01)

(52) U.S. Cl.
CPC ............ *G11C 11/4076* (2013.01); *G06F 1/12* (2013.01); *G11C 11/4072* (2013.01)

(58) Field of Classification Search
CPC .... G11C 11/4076; G11C 11/4072; G06F 1/12
See application file for complete search history.

(56) References Cited

U.S. PATENT DOCUMENTS

| | | | |
|---|---|---|---|
| 6,477,108 B2 * | 11/2002 | Arimoto | G11C 7/1072 365/194 |
| 8,055,930 B2 | 11/2011 | Bae et al. | |
| 8,115,524 B2 | 2/2012 | Kim et al. | |
| 8,254,201 B2 | 8/2012 | Sohn et al. | |
| 8,379,475 B2 | 2/2013 | Kang | |
| 8,811,111 B2 | 8/2014 | Kim et al. | |
| 9,431,093 B2 | 8/2016 | Kong | |
| 9,812,187 B2 | 11/2017 | Chen et al. | |
| 2017/0148497 A1 | 5/2017 | Na | |
| 2018/0075898 A1* | 3/2018 | Prakash | G11C 29/023 |

FOREIGN PATENT DOCUMENTS

KR 10-0878125 1/2009
KR 10-2012-0076406 7/2012

* cited by examiner

*Primary Examiner* — Ajay Ojha
(74) *Attorney, Agent, or Firm* — F. Chau & Associates, LLC

(57) ABSTRACT

A memory device includes a command decoder configured to receive a command, a data clock receiving circuit configured to receive a data clock signal, and a control logic configured to control the data clock receiving circuit based on the command decoded by the command decoder, and enable the data clock receiving circuit. The control logic enables the data clock receiving circuit in response to the memory device receiving a dynamic data clock command. The data clock receiving circuit is in an enabled state until a predetermined particular command is received.

20 Claims, 17 Drawing Sheets

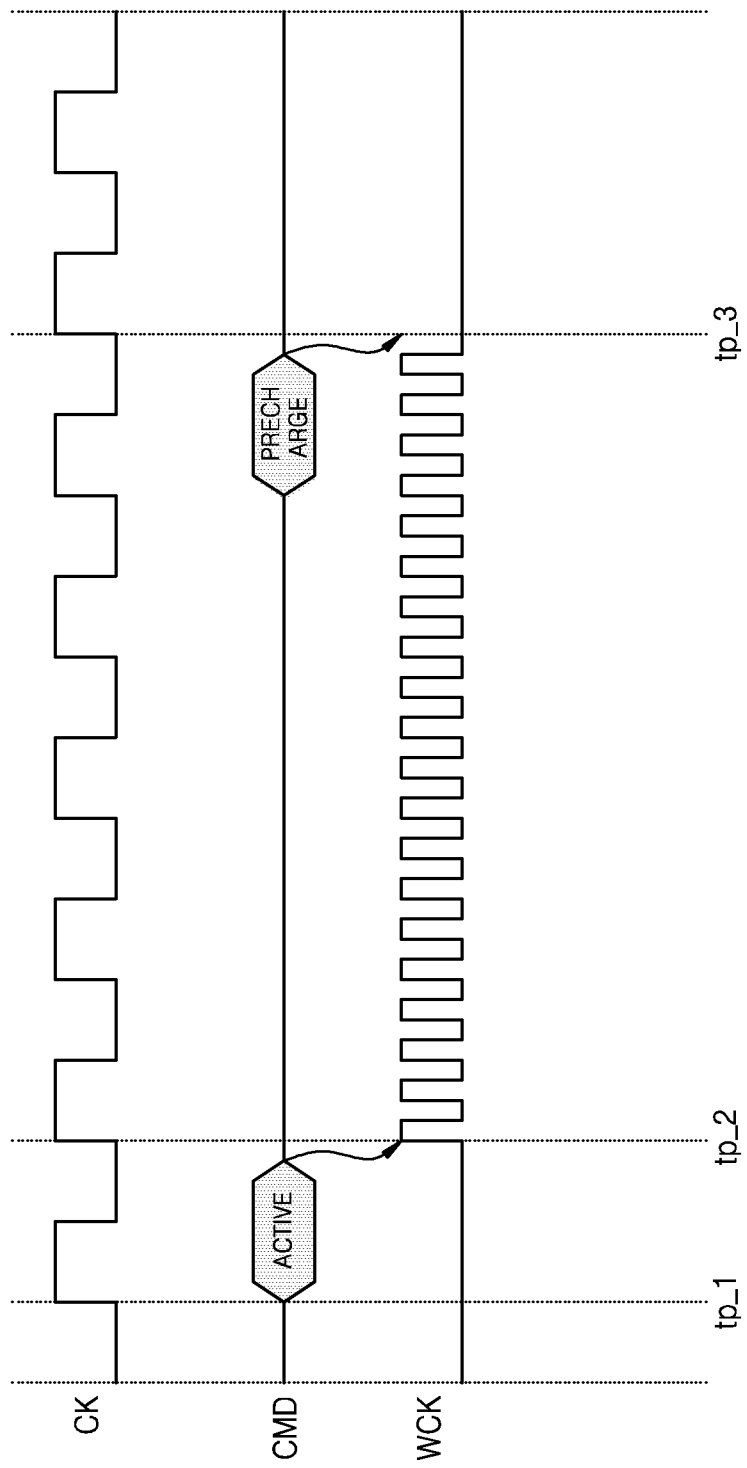

MEMORY DEVICE RECEIVING DATA CLOCK SIGNALS AND OPERATION METHOD THEREOF

CROSS-REFERENCE TO RELATED APPLICATION

This application claims priority under 35 U.S.C. § 119 to Korean Patent Application No. 10-2019-0095177, filed on Aug. 5, 2019 in the Korean Intellectual Property Office, the disclosure of which is incorporated by reference herein in its entirety.

TECHNICAL FIELD

Exemplary embodiments of the inventive concept relate to a memory device and an operation method thereof, and more particularly, to a memory device receiving data clock signals and an operation method thereof.

DISCUSSION OF RELATED ART

Mobile-oriented memory devices such as low-power double data rate (LPDDR) synchronous dynamic random access memory (SDRAM) are mainly used in mobile electronic devices such as smart phones, tablet personal computers (PCs), or ultra-books. As the capacity of mobile operating systems (OS) increases to support multi-tasking operations performed in such mobile electronic devices, the demand for mobile electronic devices with lower power consumption characteristics and high-speed operation performance also increases. To secure high-speed operation of a memory device, unnecessary periods of time consumed in the operation of the memory device need to be reduced, which may be achieved through various methods.

SUMMARY

According to an exemplary embodiment of the inventive concept, a memory device includes a command decoder configured to receive a command, a data clock receiving circuit configured to receive a data clock signal, and a control logic configured to control the data clock receiving circuit based on the command decoded by the command decoder, and enable the data clock receiving circuit. The control logic enables the data clock receiving circuit in response to the memory device receiving a dynamic data clock command. The data clock receiving circuit is in an enabled state until a predetermined particular command is received.

According to an exemplary embodiment of the inventive concept, an operation method of a memory device includes receiving a dynamic data clock command to cause a data clock receiving circuit to be in an enabled state until a predetermined particular command is received, enabling the data clock receiving circuit in response to the dynamic data clock command, receiving the predetermined particular command, and disabling the data clock receiving circuit in response to the predetermined particular command.

According to an exemplary embodiment of the inventive concept, a memory device includes a plurality of memory ranks including a first memory rank and a second memory rank, a first pin through which a data clock signal is input from outside of the memory device, a data clock receiving circuit configured to receive the data clock signal input via the first pin, a second pin through which a command is input from outside of the memory device, and a control logic configured to control a data operation of the memory device based on the command input via the second pin, enable the data clock receiving circuit based on a first command input via the second pin, control data operations of the first memory rank and the second memory rank during an interval when the data clock receiving circuit is in an enabled state, and disable the data clock receiving circuit based on a second command input via the second pin. The first command is a command that causes the data clock receiving circuit, after the data clock receiving circuit is enabled, to be maintained in an enabled state until the second command is input via the second pin.

According to an exemplary embodiment of the inventive concept, an operation method of a memory device includes receiving an active command related to a data operation of the memory device, enabling a data clock receiving circuit in response to the active command, synchronizing a data clock signal received through the data clock receiving circuit to a main clock signal, receiving a predetermined particular command, and disabling the data clock receiving circuit in response to the predetermined particular command.

According to an exemplary embodiment of the inventive concept, an operation method of a memory device includes receiving a power-down-exit command indicating termination of a power-down mode of the memory device, enabling a data clock receiving circuit in response to the power-down-exit command, synchronizing a data clock signal received through the data clock receiving circuit to a main clock signal, receiving a power-down-entry command indicating entry into the power-down mode of the memory device, and disabling the data clock receiving circuit in response to the power-down-entry command.

According to an exemplary embodiment of the inventive concept, for an operation method of a memory device including a first memory rank and a second memory rank, the operation method includes receiving a first command from a memory controller at a first time point, enabling a data clock receiving circuit in response to the first command at a second time point after the first time point, performing a first data operation command for the first memory rank at a third time point after the second time point, performing a second data operation command for the second memory rank at a fourth time point after the third time point, receiving a predetermined particular command at a fifth time point after the fourth time point, and disabling the data clock receiving circuit in response to the predetermined particular command at a sixth time point after the fifth time point.

BRIEF DESCRIPTION OF THE DRAWINGS

The above and other features of the inventive concept will be more clearly understood by describing in detail exemplary embodiments thereof with reference to the accompanying drawings.

FIG. 9A illustrates a timing diagram of signals of the memory device of FIG. 1, according to an exemplary embodiment of the inventive concept.

DETAILED DESCRIPTION OF THE EMBODIMENTS

Figure 1:
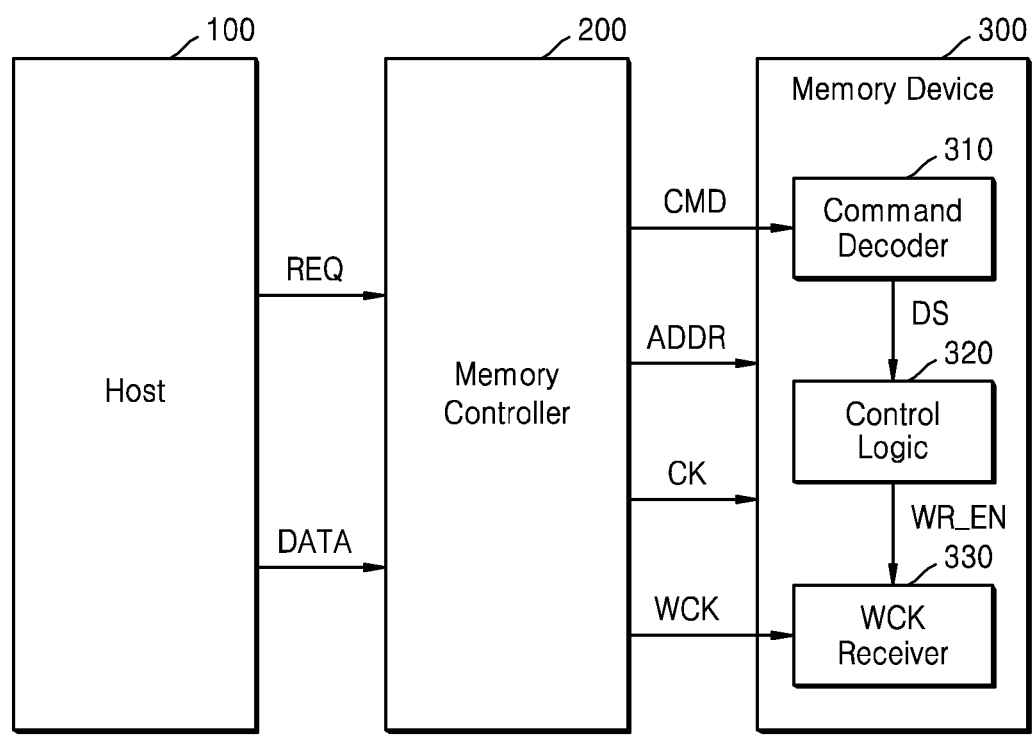
FIG. 1 illustrates a data processing system according to an exemplary embodiment of the inventive concept.

Exemplary embodiments of the inventive concept provide a memory device and an operation method of the same, and more particularly, a method and a device capable of reducing an unnecessarily consumed time in an operation of a memory device and improving an operating speed of the memory device.

Hereinafter, exemplary embodiments of the inventive concept are described in detail with reference to the accompanying drawings. Like reference numerals may refer to like elements throughout this application.

FIG. 1 illustrates a data processing system according to an exemplary embodiment of the inventive concept.

A data processing system 10 may include a host 100, a memory controller 200, and a memory device 300. The data processing system 10 may be applied to various electronic devices requiring memory such as servers, desktops, laptops, smartphones, tablet personal computers (PCs), printers, scanners, monitors, digital cameras, digital music players, digital media recorders, or portable game consoles, but is not limited thereto.

The host 100 may provide data DATA and a request signal REQ to the memory controller 200. For example, the host 100 may provide the memory controller 200 with the request signal REQ requesting a read operation or a write operation for the data DATA. In addition, the host 100 may provide commands, addresses, and priority information to the memory controller 200, but is not limited thereto. The host 100 and the memory controller 200 may exchange the data DATA and signals, based on various interface protocols such as a universal serial bus (USB) protocol, a multimedia card (MMC) protocol, a serial-advanced technology attachment (ATA) protocol, a parallel-ATA protocol, a small computer small interface (SCSI) protocol, an enhanced small disk (ESDI) protocol, or an integrated drive electronics (IDE) protocol. The host 100 may be implemented, together with the memory controller 200, as a system on chip (SoC) or an application processor (AP) including a central processing unit (CPU) and/or a graphic processing unit (GPU).

The memory controller 200 may control the memory device 300 in response to the request signal REQ from the host 100. For example, the memory controller 200 may control the memory device 300 to read data DQ in response to a read request received from the host 100. Similarly, the memory controller 200 may control the memory device 300 to write the data DQ (in FIG. 2) in response to a write request received from the host 100. To this end, the memory controller 200 may provide a command CMD and an address ADDR to the memory device 300.

In an exemplary embodiment of the inventive concept, the memory controller 200 may provide the command CMD to the memory device 300 via a command pin of the memory device 300. However, the inventive concept is not limited thereto. For example, the memory controller 200 may provide the command CMD and the address ADDR to the memory device 300 via a command/address pin of the memory device 300. In addition, for example, the memory controller 200 may provide the command CMD and any other signal to the memory device 300 via a particular pin of the memory device 300. The memory controller 200 may transmit/receive the data DQ to be written or the data DQ that has been read, between the memory controller 200 and the memory device 300.

The memory controller 200 may provide a main clock signal CK and a data clock signal WCK to the memory device 300. In an exemplary embodiment of the inventive concept, the memory controller 200 may provide the data clock signal WCK to the memory device 300 via a data clock pin of the memory device 300. The main clock signal CK and the data clock signal WCK may be clock signals used for data communication in the memory controller 200 and the memory device 300. As a non-limiting example, a frequency of the data clock signal WCK may be two or four times a frequency of the main clock signal CK.

The memory device 300 may be implemented as a volatile memory device. The volatile memory device may be implemented as random access memory (RAM), dynamic RAM (DRAM), or static RAM (SRAM), but is not limited thereto. For example, the memory device 300 may include double data rate (DDR) synchronous DRAM (SDRAM) (DDR SDRAM), low power DDR (LPDDR) SDRAM (LPDR SDRAM), graphics DDR (GDDR) SDRAM (GDDR SDRAM), Rambus DRAM (RDRAM), etc. Alternatively, the memory device 300 may be implemented as high bandwidth memory (HBM). On the other hand, the memory device 300 may be implemented as a non-volatile memory device. For example, the memory device 300 may be implemented as a resistive memory such as phase change RAM (PRAM), magnetic RAM (MRAM), or resistive RAM (RRAM).

The memory device 300 may include a command decoder 310, a control logic 320, and a data clock receiver 330. Components of the memory device 300, e.g., the command decoder 310, the control logic 320, and the data clock receiver 330, may be circuits, and may be referred to as a command decoder circuit, a control logic circuit, and a data clock receiving circuit.

In an exemplary embodiment of the inventive concept, the memory device 300 may include a memory cell array, and the memory cell array may include a plurality of memory cells. For example, the memory cell array may include memory cells in a region in which a plurality of rows and a plurality of columns cross each other. The plurality of memory cells of the memory cell array may be indicated by the address ADDR, and the address ADDR may include a plurality of bits for indicating the plurality of memory cells. For example, the address ADDR may include a row address and a column address.

The command decoder 310 may generate a control signal DS corresponding to the command CMD input from the memory controller 200. The command decoder 310 may provide the control logic 320 with the control signal DS that is generated based on signals related to the command CMD, for example, a chip select signal (CAS), a row address strobe signal (RAS), a column address strobe signal (CAS), a write enable signal (WE), or a clock enable signal (CKE). In an exemplary embodiment of the inventive concept, the command decoder 310 may also decode the address ADDR from the memory controller 200.

On the other hand, the command decoder 310 may be implemented in various forms, and the command decoder 310 may be implemented in hardware or software. For example, when the command decoder 310 is implemented in hardware, the command decoder 310 may include various circuits for generating the control signal DS corresponding to the command CMD. For example, when the command decoder 310 is implemented in software, the command decoder 310 may be executed by any processor in the memory device 300 to provide the control signal DS corresponding to the command CMD. In an exemplary embodiment of the inventive concept, the command decoder 310 may be included in the control logic 320. However, the inventive concept is not limited thereto, and the command decoder 310 may be implemented in firmware by combining hardware and software therein.

The control logic 320 may control an overall operation of the memory device 300. The control logic 320 may control an operation of the memory device 300 based on the control signal DS. For example, the control logic 320 may control data operations such as a write operation, a read operation, and an erase operation of the memory device 300 based on the control signal DS.

In an exemplary embodiment of the inventive concept, the control logic 320 may control the data clock receiver 330 based on the control signal DS. For example, the control logic 320 may enable or disable the data clock receiver 330 based on the control signal DS. To this end, the control logic 320 may generate a data clock receiver enable signal WR_EN based on the control signal DS, and provide the data clock signal receiver enable signal WR_EN to the data clock receiver 330. For example, the control logic 320 may enable (or activate) the data clock receiver 330 by using the data clock receiver enable signal WR_EN having a first logic level. In addition, for example, the control logic 320 may disable (or deactivate) the data clock receiver 330 by using the data clock receiver enable signal WR_EN having a second logic level.

The data clock receiver 330 may receive the data clock signal WCK from the memory controller 200. For example, the data clock receiver 330 may receive the data clock signal WCK input via the data clock pin.

In an exemplary embodiment of the inventive concept, the data clock receiver 330 may include a buffer for receiving the data clock signal WCK. The buffer included in the data clock receiver 330 may be turned on or turned off based on the data clock receiver enable signal WR_EN transmitted from the control logic 320. The buffer may be turned on through the data clock receiver enable signal WR_EN having a first logic level, and may be turned off through the data clock receiver enable signal WR_EN having a second logic level. The data clock receiver 330 may be disabled by turning off the buffer therein.

The data clock receiver 330 may also be referred to as a data clock receiving circuit, and the data clock receiver enable signal WR_EN may also be referred to as a data clock receiving circuit enable signal.

The memory controller 200 according to an exemplary embodiment of the inventive concept may provide a newly defined command to the memory device 300. In the present specification, the newly defined command may be referred to as a dynamic data clock command. The dynamic data clock command may be a command to cause the data clock receiver 330 to be in an enabled state after the dynamic data clock command is input to the memory device 300 and before or until a predetermined particular command is input. In other words, in response to the dynamic data clock command received by the memory device 300, the memory device 300 may enable the data clock receiver 330, and the data clock receiver 330 may maintain the enabled state until the predetermined particular command is input. According to exemplary embodiments of the inventive concept, the newly defined command may be a power-down-exit command or an active command related to a data operation of the memory device 300, which similarly cause the data clock receiver 330 to be in the enabled state, and will be described in detail below.

Thereafter, in response to the predetermined particular command received by the memory device 300, the memory device 300 may disable the data clock receiver 330. In an exemplary embodiment of the inventive concept, the predetermined particular command may include a sync-off command for directing an end or termination of synchronization between the data clock signal WCK and the main clock signal CK. According to an exemplary embodiment of the inventive concept, the predetermined particular command may include a pre-charge command related to a data operation of the memory device 300. In an exemplary embodiment of the inventive concept, the predetermined particular command may include a power-down-entry command for directing a power-down mode of the memory device 300. In other words, the power-down-entry command indicates entry into the power-down mode of the memory device 300.

In addition, the memory device 300 according to an exemplary embodiment of the inventive concept may enable the data clock receiver 330, in response to receiving an active command related to the data operation of the memory device 300, and the data clock receiver 330 may maintain the enabled state until the predetermined particular command is input. Thereafter, in response to the predetermined particular command received by the memory device 300, the memory device 300 may disable the data clock receiver 330. According to an exemplary embodiment of the inventive concept, the predetermined particular command may include a pre-charge command related to a data operation of the memory device 300. In an exemplary embodiment of the inventive concept, the predetermined particular command may include the power-down-entry command for directing the power-down mode of the memory device 300.

In addition, the memory device 300 according to an exemplary embodiment of the inventive concept may enable the data clock receiver 330, in response to receiving the power-down-exit command by the memory device 300 for directing termination of a power-down mode of the memory device 300, and the data clock receiver 330 may maintain the enabled state until the power-down-entry command indicating the power-down mode of the memory device 300 is input. Thereafter, in response to the power-down-entry command received by the memory device 300, the memory device 300 may disable the data clock receiver 330.

For the data processing system 10 according to an exemplary embodiment of the inventive concept, it may be possible to reduce the time unnecessarily consumed in the operation of the memory device 300. In particular, a preamble time to synchronize the data clock signal WCK to the main clock signal CK in the memory device 300 may be reduced. In addition, the preamble time of the data clock signal WCK may be reduced in a data operation according to a rank interleaving method. Further, as the preamble time of the data clock signal WCK is reduced in the operation of the memory device 300, an operating speed of the memory device 300 may be increased, and a high-speed operation performance of the memory device 300 may be improved.

Figure 2:
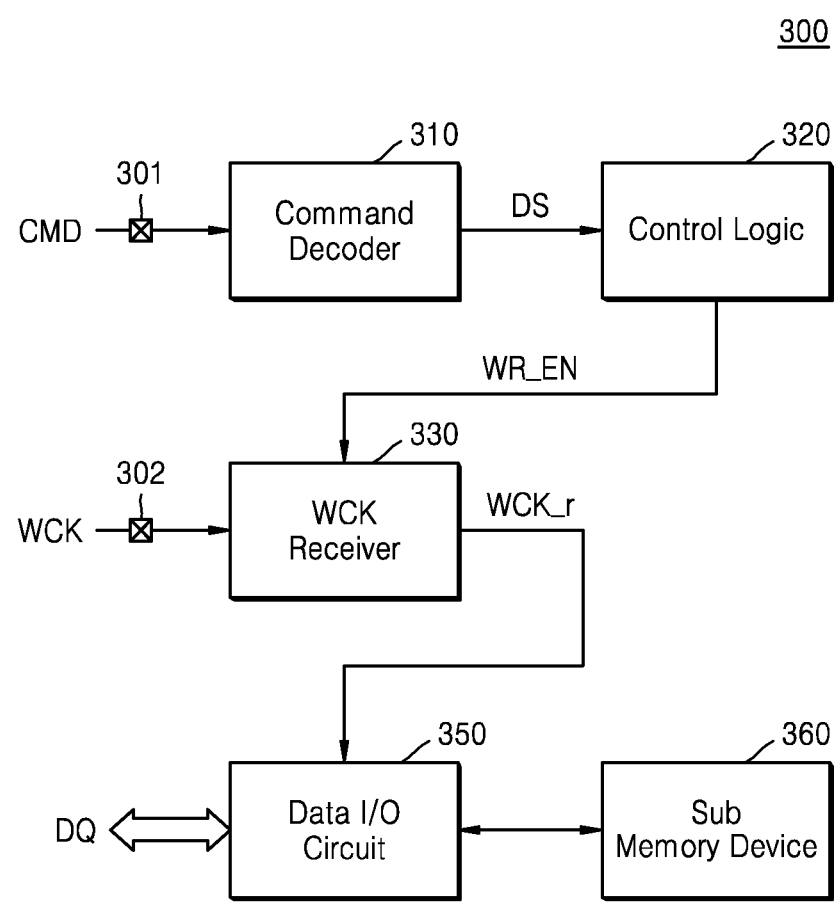
FIG. 2 illustrates a memory device of FIG. 1 according to an exemplary embodiment of the inventive concept.

FIG. 2 illustrates a memory device of FIG. 1 according to an exemplary embodiment of the inventive concept. Duplicate descriptions of the memory device 300 previously described with reference to FIG. 1 are omitted. FIG. 2 is described with reference to FIG. 1.

The memory device 300 may include a first pin 301, a second pin 302, the command decoder 310, the control logic 320, the data clock receiver 330, a data input/output (I/O) circuit 350, and a sub memory device 360.

The command decoder 310 may receive the command CMD from the memory controller 200 external to the memory device 300 via the first pin 301. In other words, the command decoder 310 may receive the command CMD input via the first pin 301. The first pin 301 may be referred to as the command pin. In addition, in an exemplary embodiment of the inventive concept, the first pin 301 may be the command/address pin that receives the command CMD and the address ADDR together. The command decoder 310 may generate the control signal DS corresponding to the command CMD, and provide the generated control signal DS to the control logic 320. As described above, the command decoder 310 may be included in the control logic 320.

The control logic 320 may control the operation of the memory device 300 based on the control signal DS, for example, the data operation of the memory device 300. In addition, for example, the control logic 320 may control the data clock receiver 330 based on the control signal DS. To this end, the control logic 320 may provide the data clock receiver enable signal WR_EN to the data clock receiver 330.

The data clock receiver 330 may receive the data clock signal WCK via the second pin 302. The second pin 302 may be referred to as the data clock pin. The data clock receiver 330 may provide a received data clock signal WCK_r to the data I/O circuit 350. The data clock receiver 330 may be enabled or disabled by the control of the control logic 320. For example, the data clock receiver 330 may be enabled or disabled based on the data clock receiver enable signal WR_EN. In an exemplary embodiment of the inventive concept, the data clock receiver 330 may include a buffer for receiving the data clock signal WCK. The received data clock signal WCK_r may represent a buffered data clock signal.

With respect to the first pin 301 and the second pin 302, the term "pin" may broadly refer to an electrical interconnection to an integrated circuit, and may include, for example, another electrical contact point on a pad or on the integrated circuit.

The data I/O circuit 350 may be connected to the sub memory device 360, and may receive the data DQ or to output the data DQ to the outside. The data I/O circuit 350 may receive the data DQ or output the data DQ, based on at least one of the received data clock signal WCK_r and an internal clock signal generated in the memory device 300. For example, in a data write operation of the memory device 300, the data I/O circuit 350 may receive the data DQ in response to the received data clock signal WCK_r. In addition, for example, in a data read operation of the memory device 300, the data I/O circuit 350 may output the data DQ to the outside based on a read strobe signal generated therein.

The sub memory device 360 may include a memory cell array, for example, a plurality of memory ranks. The memory cell array may include a plurality of memory cells. For example, the memory cell array may include memory cells in an area where a plurality of rows and a plurality of columns cross one another.

For the memory device 300 according to an exemplary embodiment of the inventive concept, it may be possible to reduce the time unnecessarily consumed in the operation of the memory device 300. In particular, in a process of synchronizing the data clock signal WCK to the main clock signal CK in the memory device 300, the time unnecessarily consumed may be reduced. In addition, in a data operation according to a rank interleaving method, the time unnecessarily consumed in the process of synchronizing the data clock signal WCK to the main clock signal CK may be reduced. Further, as the time unnecessarily consumed in the operation of the memory device 300 is reduced, an operating speed of the memory device 300 may be increased, and a high speed operation performance of the memory device 300 may be improved. A detailed operation of the memory device 300 is described in more detail with reference to FIGS. 5-11 below.

Figure 3:
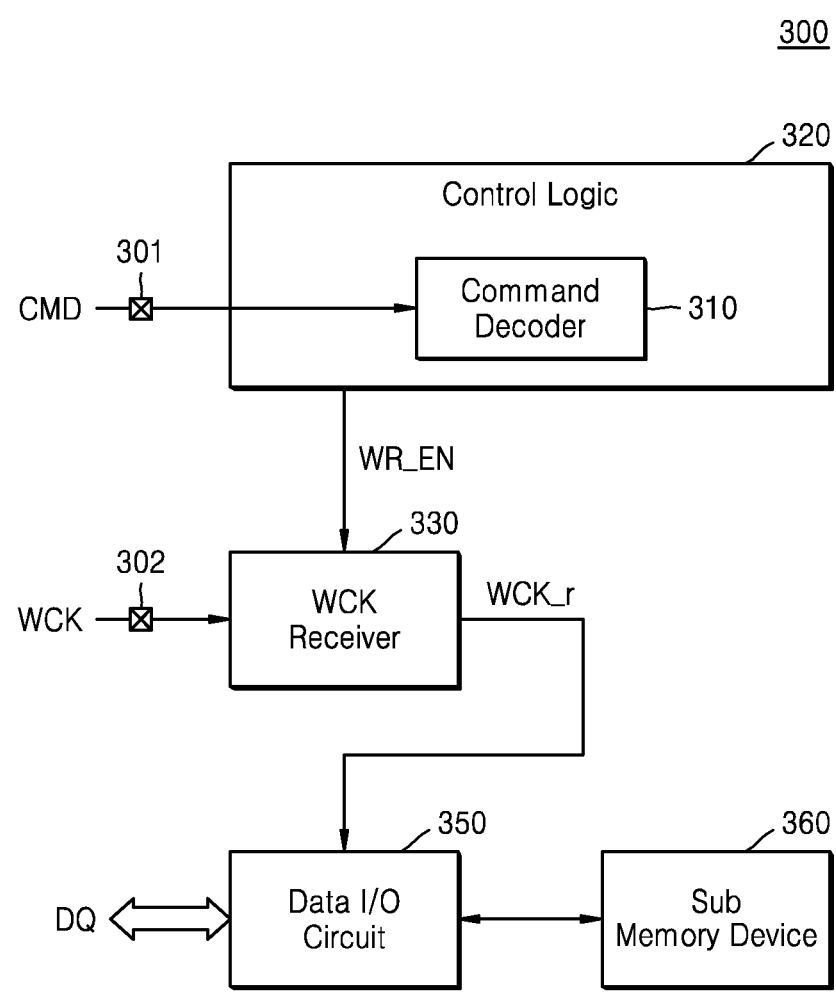
FIG. 3 illustrates the memory device of FIG. 1 according to an exemplary embodiment of the inventive concept.

FIG. 3 illustrates the memory device of FIG. 1 according to an exemplary embodiment of the inventive concept. FIG. 3 is a diagram illustrating an implementation of the memory device 300 of FIG. 1. FIG. 3 is described mainly with reference to differences from FIG. 2.

The memory device 300 may include the first pin 301, the second pin 302, the control logic 320, the data clock receiver 330, the data I/O circuit 350, and the sub memory device 360. The control logic 320 may include the command decoder 310.

In other words, the control logic 320 may perform the operations of the command decoder 310 described with reference to FIGS. 1 and 2. The control logic 320 may generate a control signal corresponding to the command CMD, and generate the data clock receiver enable signal WR_EN for controlling the data clock receiver 330 based on the control signal.

Figure 4:
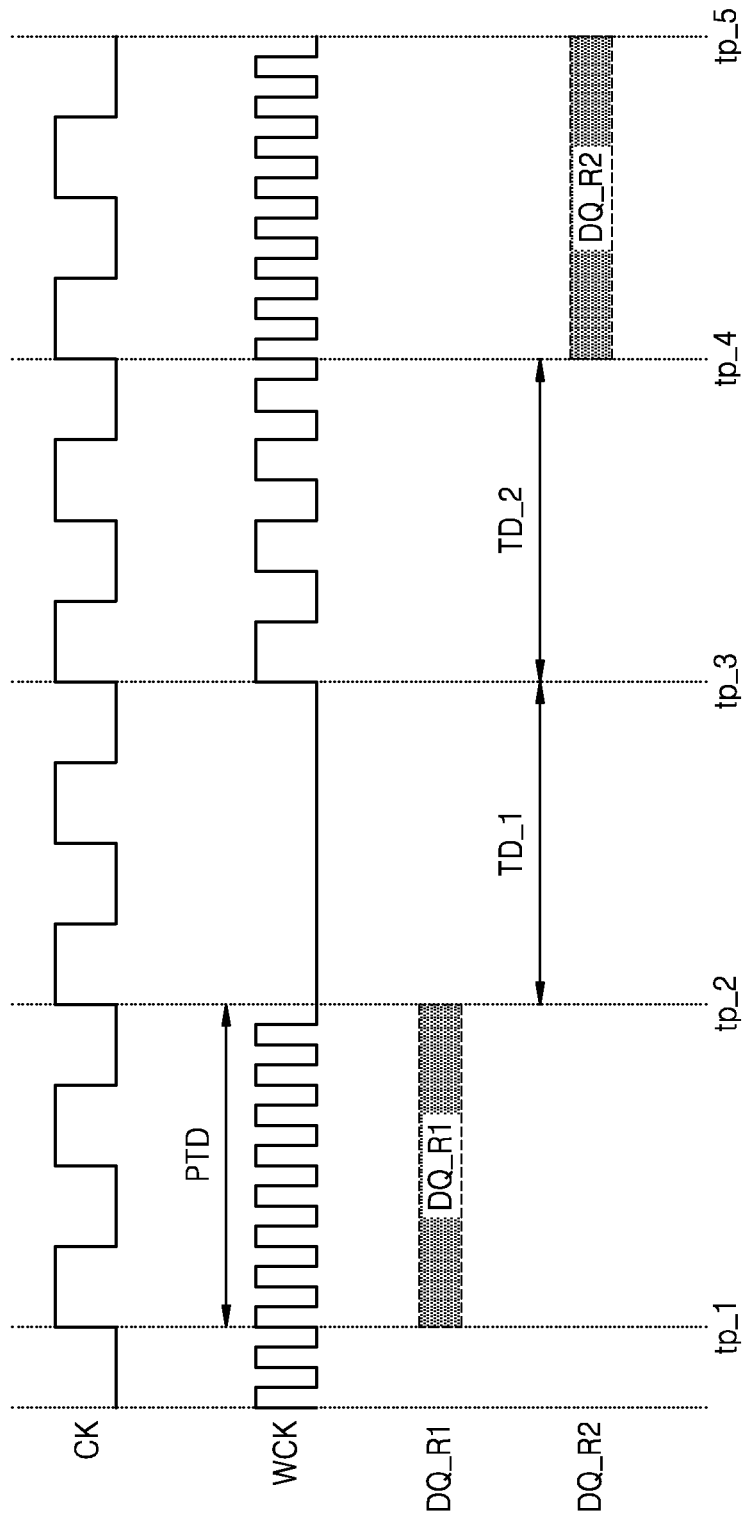
FIG. 4 illustrates a timing diagram of signals according to a comparative example.

FIG. 4 illustrates a timing diagram of signals, according to a comparative example. In particular, FIG. 4 illustrates the main clock signal CK, the data clock signal WCK, a first data DQ_R1 for a first memory rank, and a second data DQ_R2 for a second memory rank in a memory device according to the comparative example.

In the memory device according to the comparative example, the data clock signal WCK may be synchronized with the main clock signal CK at a first time point tp_1. Between the first time point tp_1 and a second time point tp_2, the first data DQ_R1 related to a data operation for the first memory rank may be synchronized with the data clock signal WCK, and may be input to the memory device or output from the memory device. Thereafter, the data clock signal WCK may be disabled after a predetermined time distance (PTD) has passed. In the present comparative example, it may be assumed that the data clock signal WCK is disabled at the second time point tp_2.

The data clock signal WCK may be received again by the memory device from a third time point tp_3 at which a first time distance TD_1 has passed from the second time point tp_2.

During a time period from the third time point tp_3 to a fourth time point tp_4, the data clock signal WCK may be synchronized with the main clock signal CK. Synchronization of the data clock signal WCK to the main clock signal CK may denote an operation of matching a phase of the data clock signal WCK with a phase of the main clock signal CK. The time period from the third time point tp_3 to the fourth time point tp_4 may be referred to as a preamble period of the data clock signal WCK.

After the synchronization of the data clock signal WCK to the main clock signal CK is completed, during a period from the fourth time point tp_4 to a fifth time point tp_5, the data DQ_R2 related to a data operation for the second memory rank may be input to the memory device or output from the memory device.

Referring to FIG. 4, in the memory device according to the comparative example, since the data clock receiving circuit is automatically disabled after the PTD has passed from an enabled time, when the data operation for the second memory rank is performed after the data operation for the first memory rank is completed, it may be necessary to perform a preamble operation for synchronizing the data clock signal WCK to the main clock signal CK. Accordingly, the preamble time equal to a second time distance TD_2 that is a time distance between the third time point tp_3 and the fourth time point tp_4 may be required. This preamble time requirement may increase an overall operation time of the memory device, and accordingly, the operating speed of the memory device may be reduced. Thus, a high speed operation performance of the memory device may be degraded.

Figure 5:
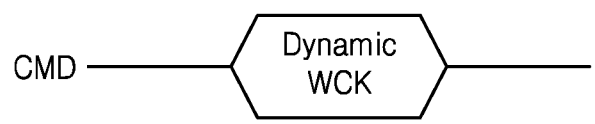
FIG. 5 illustrates a command according to an exemplary embodiment of the inventive concept.

FIG. 5 illustrates a command according to an exemplary embodiment of the inventive concept. In particular, FIG. 5 illustrates a newly defined command according to an exemplary embodiment of the inventive concept. FIG. 5 is described with reference to FIG. 1.

The memory controller 200 according to an exemplary embodiment of the inventive concept may provide a dynamic WCK command to the memory device 300. The dynamic WCK command may be a command to enable the data clock receiver 330 after the dynamic WCK command is input to the memory device 300 and before a predetermined particular command is input. In other words, in response to the dynamic WCK command received by the memory device 300, the memory device 300 may enable the data clock receiver 330, and the data clock receiver 330 may maintain the enabled state until the predetermined particular command is input. Thereafter, in response to the predetermined particular command received by the memory device 300, the memory device 300 may disable the data clock receiver 330.

In an exemplary embodiment of the inventive concept, the predetermined particular command may include a sync-off command for directing an end of synchronization between the data clock signal WCK and the main clock signal CK. Exemplary embodiments of the inventive concept related to this operation are described with reference to FIGS. 6A and 6B.

According to an exemplary embodiment of the inventive concept, the predetermined particular command may include a pre-charge command related to a data operation of the memory device 300. Exemplary embodiments of the inventive concept related to this operation are described with reference to FIGS. 7A and 7B.

In an exemplary embodiment of the inventive concept, the predetermined particular command may include a power-down-entry command for directing a power-down mode of the memory device 300. Exemplary embodiments of the inventive concept related to this operation are described with reference to FIGS. 8A and 8B.

Figure 6A:
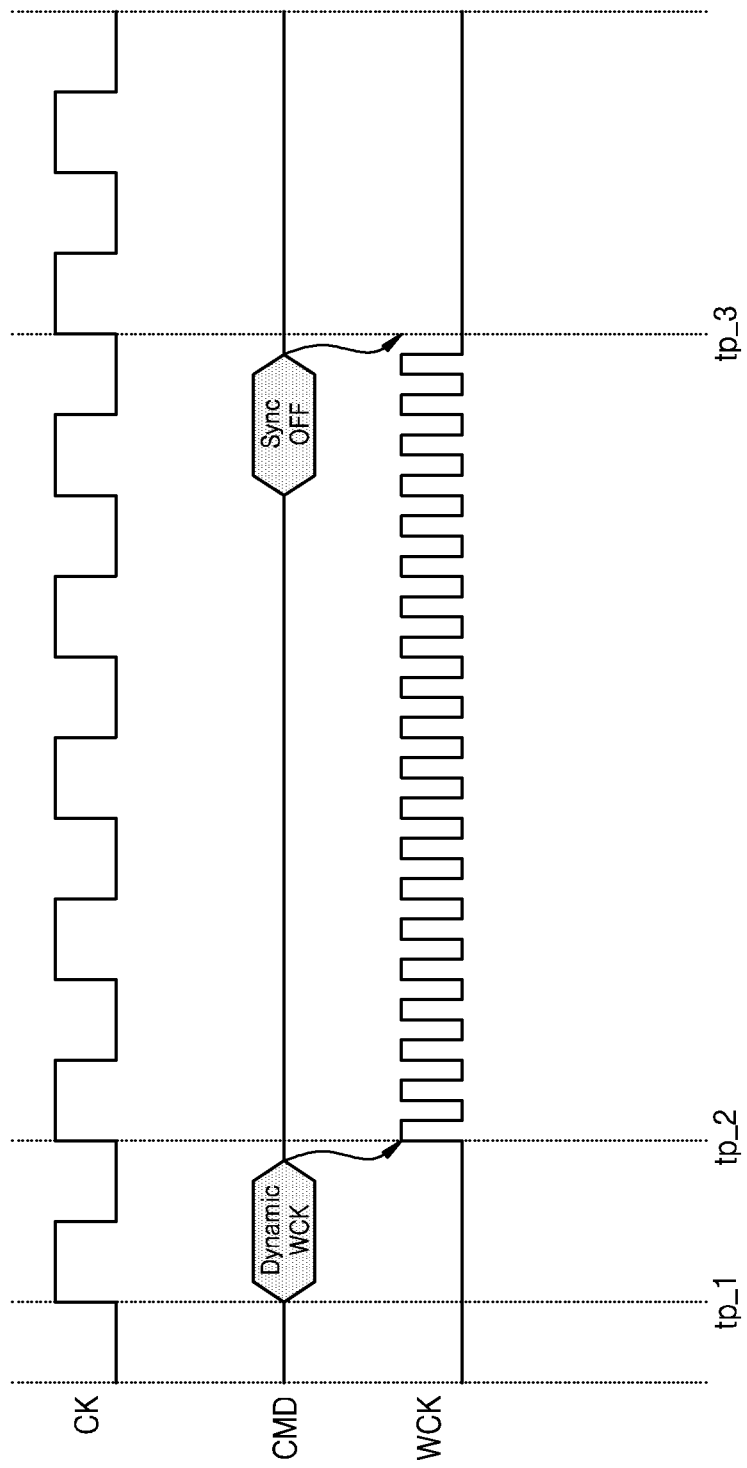
FIG. 6A illustrates a timing diagram of signals of the memory device of FIG. 1, according to an exemplary embodiment of the inventive concept.

FIG. 6A illustrates a timing diagram of signals of the memory device of FIG. 1 according to an exemplary embodiment of the inventive concept. A first time point tp_1, a second time point tp_2, and a third time point tp_3 illustrated in FIG. 6A may denote time points independent of the first view point tp_1, the second view point tp_2, and the third view point tp_3, respectively, shown in FIG. 5. FIG. 6 is described with reference to FIGS. 1 and 2 together.

The memory device 300 may receive the dynamic WCK command from the memory controller 200 at the first time point tp_1. The dynamic WCK command may also be referred to as dynamic data clock command. For example, the memory device 300 may receive the dynamic data clock command via the first pin 301. The received dynamic data clock command may be provided to the command decoder 310, and the command decoder 310 may generate the control signal DS corresponding to the dynamic data clock command by decoding the dynamic data clock command. Based on the control signal DS corresponding to the dynamic data clock command, the control logic 320 may enable the data clock receiver 330. For example, the control logic 320 may enable the data clock receiver 330 by providing the data clock receiver enable signal WR_EN having the first logic level to the data clock receiver 330.

As the data clock receiver 330 is enabled, the data clock signal WCK may be received by the memory device 300 from the second time point tp_2. FIG. 6A illustrates that the phase of the data clock signal WCK is aligned with the phase of the main clock signal CK immediately after the second time point tp_2, but this is only for convenience of description, and is not limited thereto. For example, during a predetermined time distance from the second time point tp_2, the memory device 300 may perform a synchronization operation to match the phase of the data clock signal WCK to the phase of the main clock signal CK. In other words, after the predetermined time distance passes from the second time point tp_2, the phase of the data clock signal WCK may identical to the main clock signal CK.

The data clock receiver 330 may maintain the enabled state until the sync-off command for directing the end of synchronization between the data clock signal WCK and the main clock signal CK is received by the memory device 300.

The memory device 300 may receive the sync-off command at a time point before the third time point tp_3. The received sync-off command may be provided to the command decoder 310, and the command decoder 310 may generate the control signal DS corresponding to the sync-off command by decoding the sync-off command. Based on the control signal DS corresponding to the sync-off command, the control logic 320 may disable the data clock receiver 330. For example, the control logic 320 may disable the data clock receiver 330 by providing the data clock receiver enable signal WR_EN having the second logic level to the data clock receiver 330.

As the data clock receiver 330 is disabled, the data clock signal WCK may not be received by the memory device 300 beginning from the third time point tp_3.

According to the memory device 300 and the newly defined dynamic data clock command in the exemplary embodiment of the inventive concept, the memory device 300 may receive the data clock signal WCK until the sync-off command is received. Accordingly, even when the data operation for the second memory rank after the data operation for the first memory rank is performed, the operation of re-synchronizing the data clock signal WCK to the main clock signal CK may not need to be performed. As a result, the time unnecessarily consumed in the memory device 300 may be reduced, and thus the operating speed of the memory device 300 may be improved.

Figure 6B:
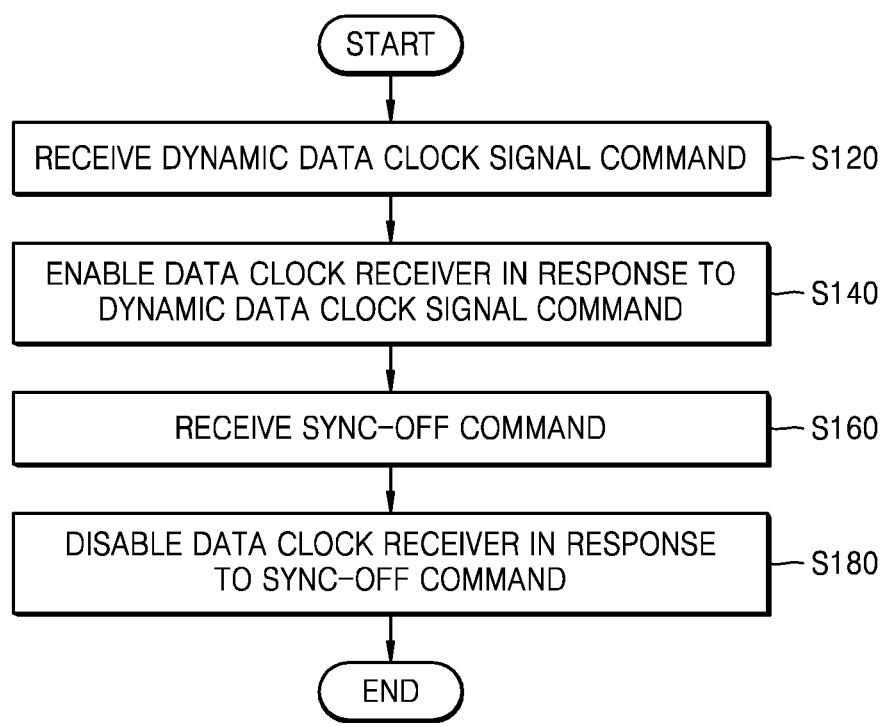
FIG. 6B is a flowchart for explaining an operation method of the memory device of FIG. 6A, according to an exemplary embodiment of the inventive concept.

FIG. 6B is a flowchart for explaining an operation method of the memory device of FIG. 6A, according to an exemplary embodiment of the inventive concept. FIG. 6B particularly illustrates a flowchart for explaining the operation method of the memory device 300, according to an exemplary embodiment of the inventive concept described with reference to FIG. 6A. FIG. 6B is described with reference to FIGS. 1, 2, and 6A together.

The memory device 300 may receive the dynamic data clock command (S120). For example, the memory device 300 may receive the dynamic data clock command from the memory controller 200 via the first pin 301. The received dynamic data clock command may be decoded by the command decoder 310. The command decoder 310 may generate the control signal DS corresponding to the dynamic data clock command by decoding the dynamic data clock command.

The memory device 300 may enable the data clock receiver 330 in response to the dynamic data clock command (S140). For example, the control logic 320 may enable the data clock receiver 330 based on the control signal DS corresponding to the dynamic data clock command. For example, the control logic 320 may enable the data clock receiver 330 by providing the data clock receiver enable signal WR_EN having the first logic level to the data clock receiver 330. In an exemplary embodiment of the inventive concept, after the data clock receiver 330 is enabled, the memory device 300 may perform an operation of synchronizing the data clock signal WCK to the main clock signal CK.

The memory device 300 may receive the sync-off command (S160). For example, the memory device 300 may receive the sync-off command from the memory controller 200 via the first pin 301. The received sync-off command may be decoded by the command decoder 310. The command decoder 310 may generate the control signal DS corresponding to the sync-off command by decoding the sync-off command.

The memory device 300 may disable the data clock receiver 330 in response to the sync-off command (S180). For example, the control logic 320 may disable the data clock receiver 330 based on the control signal DS corresponding to the sync-off command. For example, the control logic 320 may disable the data clock receiver 330 by providing the data clock receiver enable signal WR_EN having the second logic level to the data clock receiver 330.

Figure 7A:
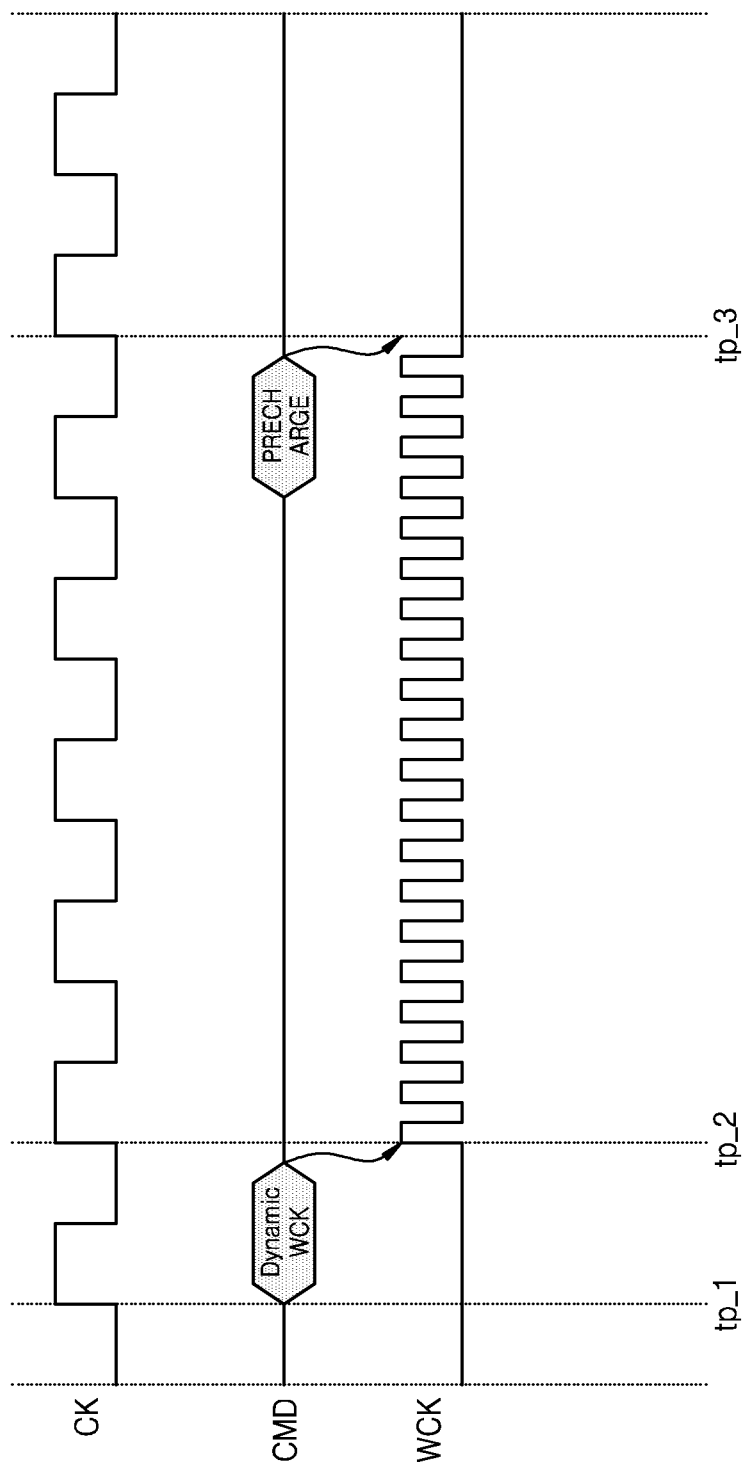
FIG. 7A illustrates a timing diagram of signals of the memory device of FIG. 1, according to an exemplary embodiment of the inventive concept.

FIG. 7A illustrates a timing diagram of signals of the memory device of FIG. 1, according to an exemplary embodiment of the inventive concept. A first time point tp_1, a second time point tp_2, and a third time point tp_3 illustrated in FIG. 7A may denote time points independent of the first view point tp_1, the second view point tp_2, and the third view point tp_3, respectively, shown in previous drawings. FIG. 7A is described with reference to FIGS. 1 and 2 together.

In FIG. 7A, the operation until the pre-charge command is received may be understood to be substantially the same as the operation before the sync-off command is received in FIG. 6A, and a description thereof is omitted.

The data clock receiver 330 may maintain the enabled state until a pre-charge command related to a data operation of the memory device 300 is received by the memory device 300.

The memory device 300 may receive the pre-charge command at a time point before the third time point tp_3. The received pre-charge command may be provided to the command decoder 310, and the command decoder 310 may generate the control signal DS corresponding to the pre-charge command by decoding the pre-charge command. Based on the control signal DS corresponding to the pre-charge command, the control logic 320 may disable the data clock receiver 330.

As the data clock receiver 330 is disabled, the data clock signal WCK may not be received by the memory device 300 beginning from the third time point tp_3.

According to the memory device 300 and the newly defined dynamic data clock command in the exemplary embodiment of the inventive concept, the memory device 300 may receive the data clock signal WCK until the pre-charge command is received. Accordingly, even when the data operation for the second memory rank is performed after the data operation for the first memory rank is performed, the operation of re-synchronizing the data clock signal WCK to the main clock signal CK may not need to be performed. As a result, the time unnecessarily consumed in the memory device 300 may be reduced, and thus the operating speed of the memory device 300 may be improved.

Figure 7B:
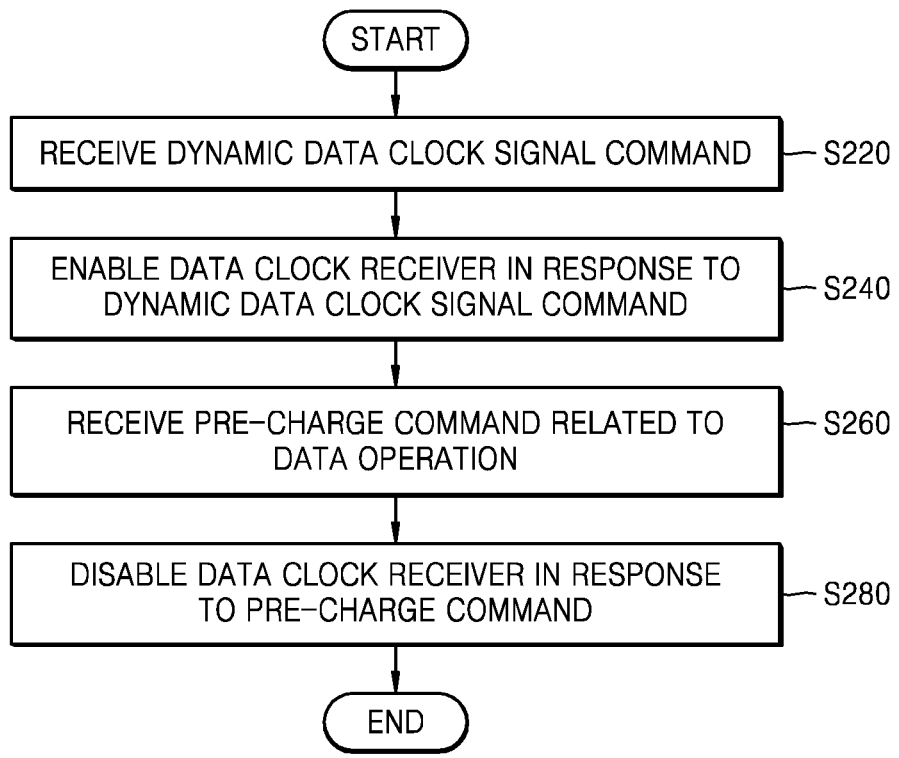
FIG. 7B is a flowchart for explaining an operation method of the memory device of FIG. 7A, according to an exemplary embodiment of the inventive concept.

FIG. 7B is a flowchart for explaining an operation method of the memory device of FIG. 7A, according to an exemplary embodiment of the inventive concept. FIG. 7B particularly illustrates a flowchart for explaining the operation method of the memory device 300, according to an exemplary embodiment of the inventive concept described with reference to FIG. 7A. FIG. 7B is described with reference to FIGS. 1, 2, and 7A together.

In FIG. 7B, operation S220 may be substantially the same as operation S120 in FIG. 6B, and operation S240 may be understood to be substantially the same as operation S140 in FIG. 6B, and descriptions thereof are omitted.

The memory device 300 may receive the pre-charge command (S260). For example, the memory device 300 may receive the pre-charge command from the memory controller 200 via the first pin 301. The received pre-charge command may be decoded by the command decoder 310. The command decoder 310 may generate the control signal DS corresponding to the pre-charge command by decoding the pre-charge command.

The memory device 300 may disable the data clock receiver 330 in response to the pre-charge command (S280). For example, the control logic 320 may disable the data clock receiver 330 based on the control signal DS corresponding to the pre-charge command. For example, the control logic 320 may disable the data clock receiver 330 by providing the data clock receiver enable signal WR_EN having the second logic level to the data clock receiver 330.

Figure 8A:
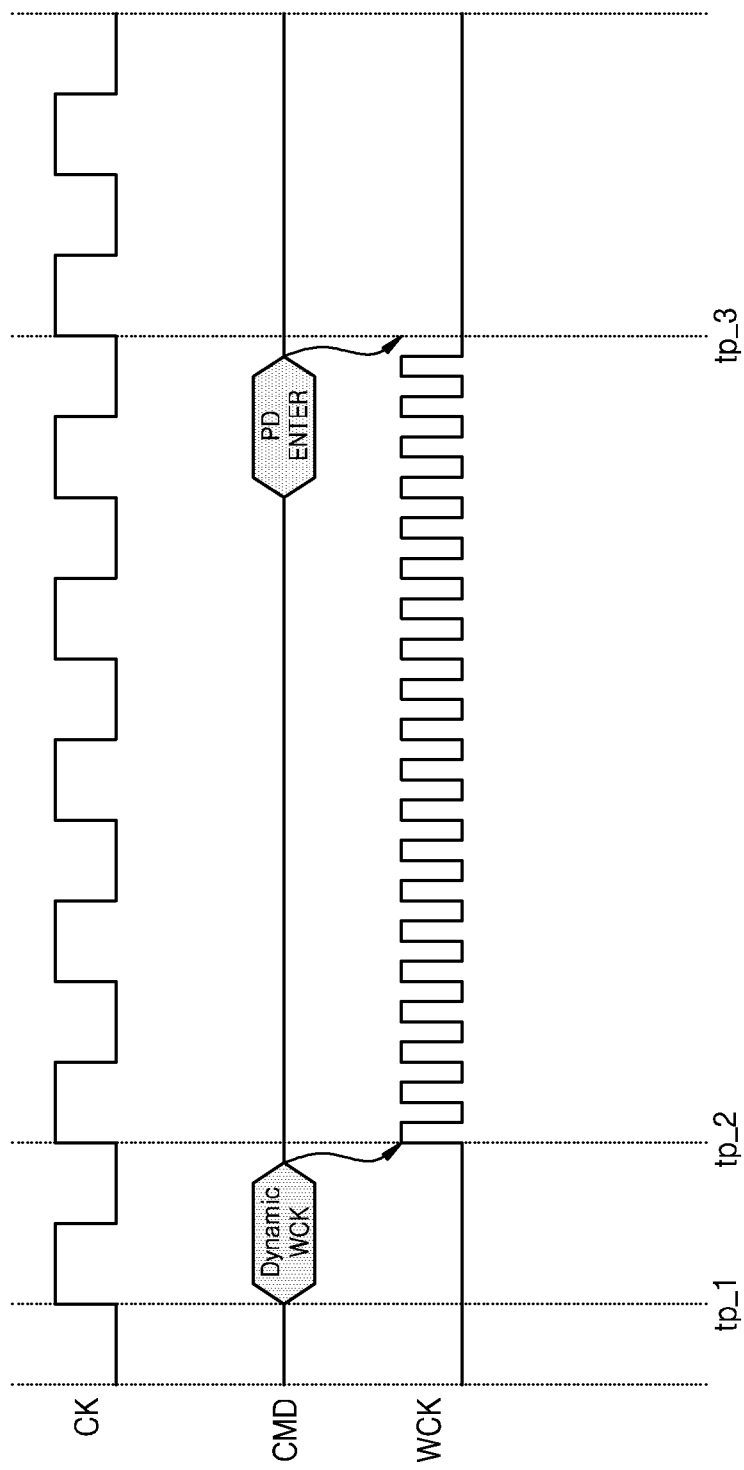
FIG. 8A illustrates a timing diagram of signals of the memory device of FIG. 1, according to an exemplary embodiment of the inventive concept.

FIG. 8A illustrates a timing diagram of signals of the memory device of FIG. 1, according to an exemplary embodiment of the inventive concept. A first time point tp_1, a second time point tp_2, and a third time point tp_3 illustrated in FIG. 8A may denote time points independent of the first view point tp_1, the second view point tp_2, and the third view point tp_3, respectively, shown in previous drawings. FIG. 8A is described with reference to FIGS. 1 and 2 together.

In FIG. 8A, the operation until the power-down-entry command is received may be understood to be substantially the same as the operation before the sync-off command is received in FIG. 6A, and a description thereof is omitted.

The data clock receiver 330 may maintain the enabled state until the power-down-entry command directing the power-down-entry operation of the memory device 300 is received by the memory device 300.

The memory device 300 may receive the power-down-entry command at a time point before the third time point tp_3. The received power-down-entry command may be provided to the command decoder 310, and the command decoder 310 may generate the control signal DS corresponding to the power-down-entry command by decoding the power-down-entry command. Based on the control signal DS corresponding to the power-down-entry command, the control logic 320 may disable the data clock receiver 330.

As the data clock receiver 330 is disabled, the data clock signal WCK may not be received by the memory device 300 beginning from the third time point tp_3.

According to the memory device 300 and the newly defined dynamic data clock command in the exemplary embodiment of the inventive concept, the memory device 300 may receive the data clock signal WCK until the power-down-entry command is received. Accordingly, even when the data operation for the second memory rank is performed after the data operation for the first memory rank is performed, the operation of re-synchronizing the data clock signal WCK to the main clock signal CK may not need to be performed. As a result, the time unnecessarily consumed in the memory device 300 may be reduced, and thus the operating speed of the memory device 300 may be improved.

Figure 8B:
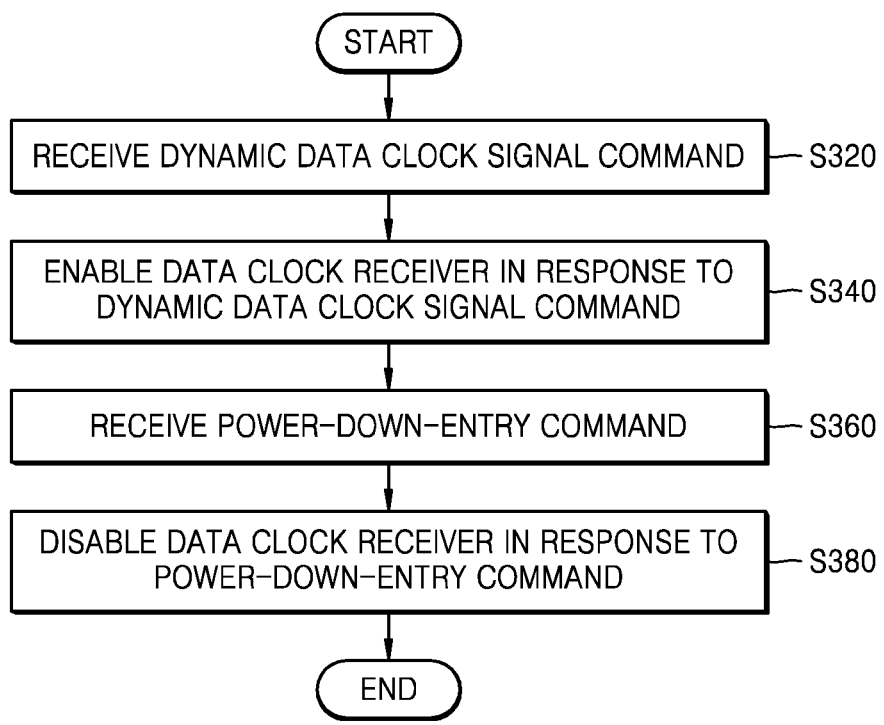
FIG. 8B is a flowchart for explaining an operation method of the memory device of FIG. 8A, according to an exemplary embodiment of the inventive concept.

FIG. 8B is a flowchart for explaining an operation method of the memory device of FIG. 8A, according to an exemplary embodiment of the inventive concept. FIG. 8B particularly illustrates a flowchart for explaining the operation method of the memory device 300, according to an exemplary embodiment of the inventive concept described with reference to FIG. 8A. FIG. 8B is described with reference to FIGS. 1, 2, and 8A together.

In FIG. 8B, operation S320 may be substantially the same as operation S120 in FIG. 6B, and operation S340 may be understood to be substantially the same as operation S140 in FIG. 6B, and descriptions thereof are omitted.

The memory device 300 may receive the power-down-entry command (S360). For example, the memory device 300 may receive the power-down-entry command from the memory controller 200 via the first pin 301. The received power-down-entry command may be decoded by the command decoder 310. The command decoder 310 may generate the control signal DS corresponding to the power-down-entry command by decoding the power-down-entry command.

The memory device 300 may disable the data clock receiver 330 in response to the power-down-entry command (S380). For example, the control logic 320 may disable the data clock receiver 330 based on the control signal DS corresponding to the power-down-entry command. For example, the control logic 320 may disable the data clock receiver 330 by providing the data clock receiver enable signal WR_EN having the second logic level to the data clock receiver 330.

FIG. 9A illustrates a timing diagrams of signals of the memory device of FIG. 1, according to an exemplary embodiment of the inventive concept. A first time point tp_1, a second time point tp_2, and a third time point tp_3 illustrated in FIG. 9A may denote time points independent of the first view point tp_1, the second view point tp_2, and the third view point tp_3, respectively, shown in previous drawings. FIG. 9A is described with reference to FIGS. 1 and 2 together.

The memory device 300 may receive an active command related to the data operation of the memory device 300 from the memory controller 200 at the first time point tp_1. For example, the memory device 300 may receive the active command via the first pin 301. The received active command may be provided to the command decoder 310, and the command decoder 310 may generate the control signal DS corresponding to the active command by decoding the active command. Based on the control signal DS corresponding to the active command, the control logic 320 may enable the data clock receiver 330.

As the data clock receiver 330 is enabled, the data clock signal WCK may be received by the memory device 300 beginning from the second time point tp_2. FIG. 9A illustrates that the phase of the data clock signal WCK is aligned with the phase of the main clock signal CK immediately after the second time point tp_2, but this is only for convenience of description, and is not limited thereto. For example, during a predetermined time distance from the second time point tp_2, the memory device 300 may perform the synchronization operation to match the phase of the data clock signal WCK to the phase of the main clock signal CK. In other words, after the predetermined time distance passes from the second time point tp_2, the phase of the data clock signal WCK may be identical to the main clock signal CK.

The data clock receiver 330 may maintain the enabled state until a pre-charge command related to a data operation of the memory device 300 is received by the memory device 300.

The memory device 300 may receive the pre-charge command at a time point before the third time point tp_3. The received pre-charge command may be provided to the command decoder 310, and the command decoder 310 may generate the control signal DS corresponding to the pre-charge command by decoding the pre-charge command. Based on the control signal DS corresponding to the pre-charge command, the control logic 320 may disable the data clock receiver 330.

As the data clock receiver 330 is disabled, the data clock signal WCK may not be received by the memory device 300 beginning from the third time point tp_3.

According to the memory device 300 in the exemplary embodiment of the inventive concept, the memory device 300 may receive the data clock signal WCK until the pre-charge command is received. Accordingly, even when the data operation for the second memory rank is performed after the data operation for the first memory rank, the operation of re-synchronizing the data clock signal WCK to the main clock signal CK may not need to be performed. As a result, the time unnecessarily consumed in the memory device 300 may be reduced, and thus the operating speed of the memory device 300 may be improved.

Figure 9B:
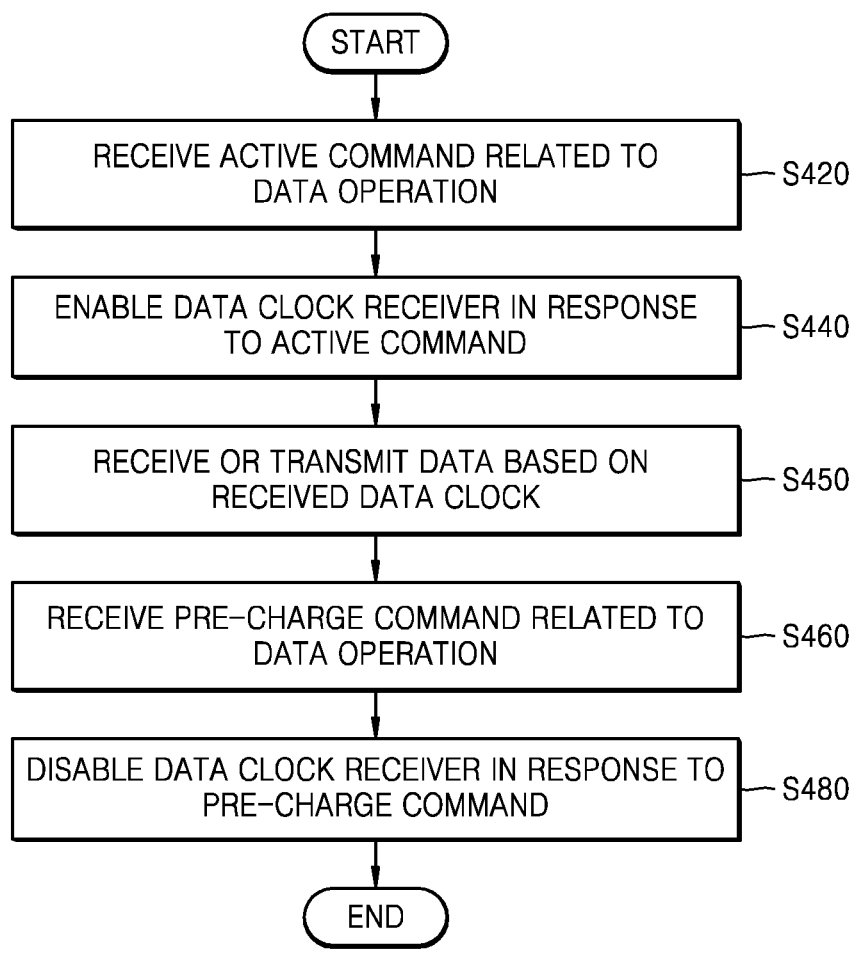
FIG. 9B is a flowchart for explaining an operation method of the memory device of FIG. 9A, according to an exemplary embodiment of the inventive concept.

FIG. 9B is a flowchart for explaining an operation method of the memory device of FIG. 9A, according to an exemplary embodiment of the inventive concept. FIG. 9B particularly illustrates a flowchart for explaining the operation method of the memory device 300, according to an exemplary embodiment of the inventive concept described with reference to FIG. 9A. FIG. 9B is described with reference to FIGS. 1, 2, and 9A together.

The memory device 300 may receive the active command related to the data operation (S420). For example, the memory device 300 may receive the active command from the memory controller 200 via the first pin 301. The received active command may be decoded by the command decoder 310. The command decoder 310 may generate the control signal DS corresponding to the active command by decoding the active command.

The memory device 300 may enable the data clock receiver 330 in response to the active command (S440). For example, the control logic 320 may enable the data clock receiver 330 based on the control signal DS corresponding to the active command. For example, the control logic 320 may enable the data clock receiver 330 by providing the data clock receiver enable signal WR_EN having the first logic level to the data clock receiver 330. In an exemplary embodiment of the inventive concept, after the data clock receiver 330 is enabled, the memory device 300 may perform an operation of synchronizing the data clock signal WCK to the main clock signal CK.

The memory device 300 may receive or transmit data based on the received data clock signal WCK (S450). For example, when the memory device 300 performs a write operation, the memory device 300 may receive data based on the data clock signal WCK between operations S440 and S460. Additionally, for example, when the memory device 300 performs a read operation, the memory device 300 may, between operations S440 and S460, transmit data to the outside based on a read data strobe signal generated based on the data clock signal WCK.

The memory device 300 may receive the pre-charge command (S460). For example, the memory device 300 may receive the pre-charge command from the memory controller 200 via the first pin 301. The received pre-charge command may be decoded by the command decoder 310. The command decoder 310 may generate the control signal DS corresponding to the pre-charge command by decoding the pre-charge command.

The memory device 300 may disable the data clock receiver 330 in response to the pre-charge command (S480). For example, the control logic 320 may disable the data clock receiver 330 based on the control signal DS corresponding to the pre-charge command. The data clock receiver 330 may be disabled after the receiving or transmitting of the data is completed. For example, the control logic 320 may disable the data clock receiver 330 by providing the data clock receiver enable signal WR_EN having the second logic level to the data clock receiver 330.

Figure 10:
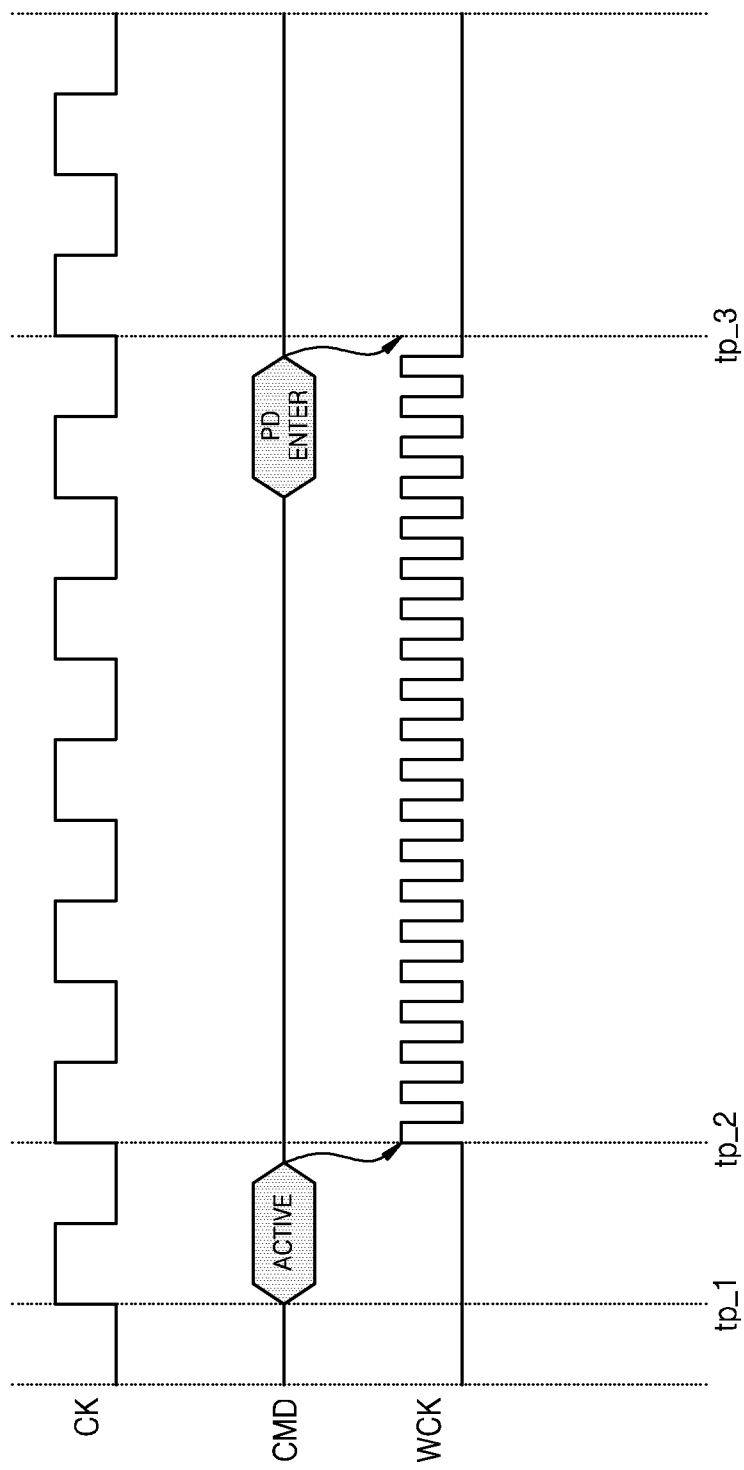
FIG. 10 is a flowchart for explaining an operation method of the memory device of FIG. 1, according to an exemplary embodiment of the inventive concept.

FIG. 10 is a flowchart for explaining an operation method of the memory device of FIG. 1, according to an exemplary embodiment of the inventive concept. A first time point tp_1, a second time point tp_2, and a third time point tp_3 illustrated in FIG. 10 may denote time points independent of the first view point tp_1, the second view point tp_2, and the third view point tp_3, respectively, shown in previous drawings. FIG. 10 is described with reference to FIGS. 1 and 2 together.

In FIG. 10, the operation until the power-down-entry command is received may be understood to be substantially the same as the operation before the pre-charge command is received in FIG. 9A, and a description thereof is omitted.

The data clock receiver 330 may maintain the enabled state until the power-down-entry command directing the power-down-entry operation of the memory device 300 is received by the memory device 300.

The memory device 300 may receive the power-down-entry command at a time point before the third time point tp_3. The received power-down-entry command may be provided to the command decoder 310, and the command decoder 310 may generate the control signal DS corresponding to the power-down-entry command by decoding the power-down-entry command. Based on the control signal DS corresponding to the power-down-entry command, the control logic 320 may disable the data clock receiver 330.

As the data clock receiver 330 is disabled, the data clock signal WCK may not be received by the memory device 300 beginning from the third time point tp_3.

Figure 11:
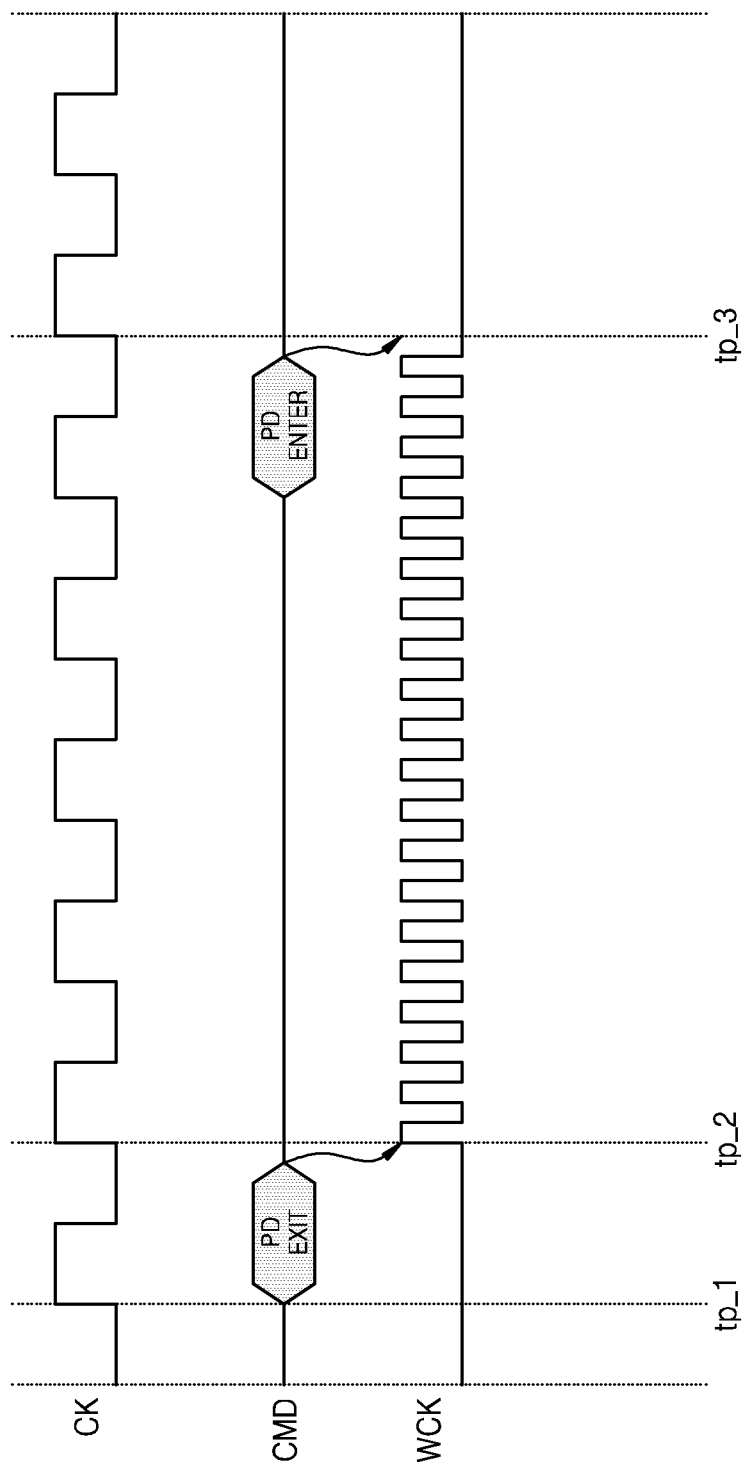
FIG. 11 is a flowchart for explaining an operation method of the memory device of FIG. 1, according to an exemplary embodiment of the inventive concept.

FIG. 11 is a flowchart for explaining an operation method of the memory device of FIG. 1, according to an exemplary embodiment of the inventive concept. A first time point tp_1, a second time point tp_2, and a third time point tp_3 illustrated in FIG. 11 may denote time points independent of the first view point tp_1, the second view point tp_2, and the third view point tp_3, respectively, shown in previous drawings. FIG. 11 is described with reference to FIGS. 1 and 2 together.

The memory device 300 may receive a power-down-exit command directing termination of a power-down mode of the memory device 300 from the memory controller 200 at the first time point tp_1. For example, the memory device 300 may receive the power-down-exit command via the first pin 301. The received power-down-exit command may be provided to the command decoder 310, and the command decoder 310 may generate the control signal DS corresponding to the power-down-exit command by decoding the power-down-exit command. Based on the control signal DS corresponding to the power-down-exit command, the control logic 320 may enable the data clock receiver 330.

As the data clock receiver 330 is enabled, the data clock signal WCK may be received by the memory device 300 beginning from the second time point tp_2. FIG. 11 illustrates that the phase of the data clock signal WCK is aligned with the phase of the main clock signal CK immediately after the second time point tp_2, but this is only for convenience of description, and is not limited thereto. For example, during a predetermined time distance from the second time point tp_2, the memory device 300 may perform the synchronization operation to match the phase of the data clock signal WCK to the phase of the main clock signal CK. In other words, after the predetermined time distance passes from the second time point tp_2, the phase of the data clock signal WCK may identical to the main clock signal CK.

The data clock receiver 330 may maintain the enabled state until the power-down-entry command directing the power-down-entry operation of the memory device 300 is received by the memory device 300.

The memory device 300 may receive the power-down-entry command at a time point before the time point tp_3. The received power-down-entry command may be provided to the command decoder 310, and the command decoder 310 may generate the control signal DS corresponding to the power-down-entry command by decoding the power-down-entry command. Based on the control signal DS corresponding to the power-down-entry command, the control logic 320 may disable the data clock receiver 330.

As the data clock receiver 330 is disabled, the data clock signal WCK may not be received by the memory device 300 beginning from the third time point tp_3.

Figure 12:
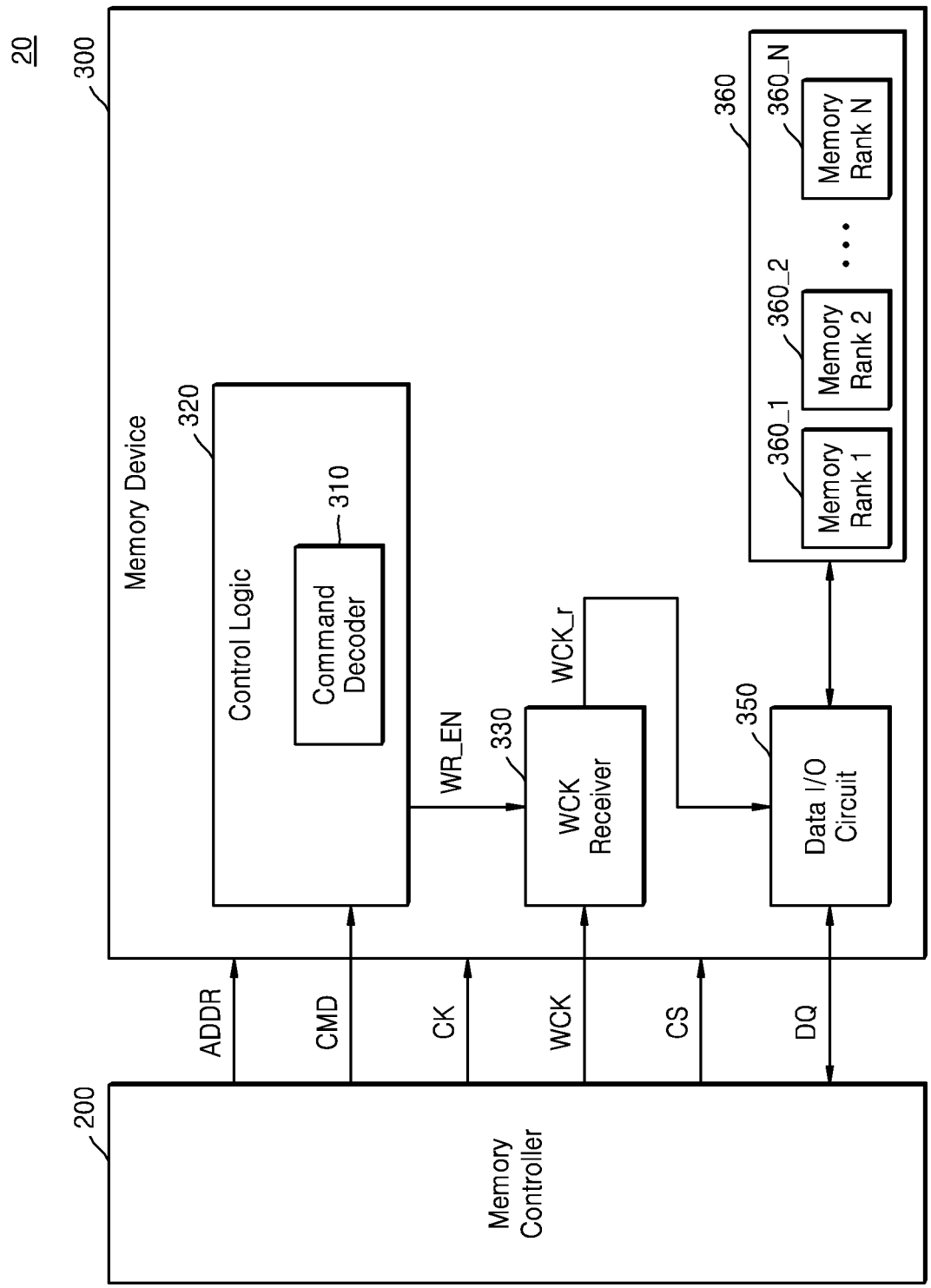
FIG. 12 illustrates a memory system according to an exemplary embodiment of the inventive concept.

FIG. 12 illustrates a memory system according to an exemplary embodiment of the inventive concept. A memory system 20 may include the memory controller 200 and the memory device 300. Duplicate descriptions of the memory controller 200 and the memory device 300 previously described with reference to FIGS. 1, 2, and 3 are omitted.

The memory device 300 may include the control logic 320, the data clock receiver 330, the data I/O circuit 350, and the sub memory device 360. The control logic 320 may include the command decoder 310. However, the inventive concept is not limited to the exemplary embodiment shown in FIG. 12, and as illustrated in FIG. 2, the command decoder 310 may be configured as hardware independent of the control logic 320.

The sub memory cell device 360 may include a plurality of memory ranks. For example, the sub memory device 360 may include first memory rank 360_1 through $N^{th}$ memory rank 360_N (where N is a natural number of 2 or more).

The memory controller 200 may select at least one memory rank among the plurality of memory ranks by providing a chip set signal CS to the memory device 300. For example, as the memory controller 200 provides the chip set signal CS corresponding to the first memory rank 360_1 to the memory device 300, the first memory rank 360_1 may be selected, and as the memory controller 200 provides the chip set signal CS corresponding to the second memory rank 360_2 to the memory device 300, the second memory rank 360_2 may be selected.

The memory controller 200 may control the memory device 300 to perform the data operation by using the rank interleaving method when the memory device 300 performs the data operation on a plurality of memory ranks. For example, when the memory device 300 writes the data DQ to the sub memory device 360, the data DQ may be partitioned in an interleaving unit. Data divided in an interleaving unit may be written in the plurality of memory ranks in a pipeline manner. For example, after a first divided data is written in the first memory rank 360_1, a second divided data may be written in the second memory rank 360_2.

The exemplary embodiments described with reference to FIGS. 5 through 11 may be similarly applied to the memory system 20 of FIG. 12.

For example, in an exemplary embodiment of the inventive concept, in response to the memory device 300 receiving the dynamic data clock command, the control logic 320 may enable the data clock receiver 330. The data clock receiver 330 may remain in an enabled state until the sync-off command is received by the memory device 300. The memory device 300 may perform the data operation on the plurality of memory ranks, and for example, may perform the data operation on the first memory rank 360_1 and the second memory rank 360_2. For example, the memory device 300 may perform the data operation on the first memory rank 360_1 and the second memory rank 360_2 according to the rank interleaving method. After the data operation on the first memory rank 360_1 and the second memory rank 360_2 is completed, the memory device 300 may receive the sync-off command. In response to the memory device 300 receiving the sync-off command, the control logic 320 may disable the data clock receiver 330. When the exemplary embodiment in FIG. 12 is compared with the comparison example shown in FIG. 4, and the data operation on the second memory rank 360_2 is performed, since the synchronization operation on the data clock signal WCK does not need to be performed, unnecessarily consumed time may be reduced, and the performance of the memory device 300 may be improved.

Similarly, in an exemplary embodiment of the inventive concept, in the data operation of the rank interleaving method for the first memory rank 360_1 and the second memory rank 360_2, in response to the memory device 300 receiving the dynamic data clock command, the control logic 320 may enable the data clock receiver 330. After the memory device 300 performs the data operation on the first memory rank 360_1, and the data DQ related to the data operation on the second memory rank 360_2 is input to the memory device 300, or output from the memory device 300, the memory device 300 may receive the pre-charge command related to the data operation on the second memory rank 360_2. In response to the memory device 300 receiving the pre-charge command related to the data operation on the second memory rank 360_2, the control logic 320 may disable the data clock receiver 330.

Similarly, in an exemplary embodiment of the inventive concept, in the data operation of the rank interleaving method for the first memory rank 360_1 and the second memory rank 360_2, in response to the memory device 300 receiving the dynamic data clock command, the control logic 320 may enable the data clock receiver 330. Thereafter, the memory device 300 may perform the data operation on the first memory rank 360_1 and the second memory rank 360_2. Thereafter, in response to the memory device 300 receiving the power-down-entry command, the control logic 320 may disable the data clock receiver 330.

Similarly, in an exemplary embodiment of the inventive concept, in the data operation of the rank interleaving method for the first memory rank 360_1 and the second memory rank 360_2, in response to the memory device 300 receiving the active command related to the data operation on the first memory rank 360_1, the control logic 320 may enable the data clock receiver 330. After the memory device 300 performs the data operation on the first memory rank 360_1, and the data DQ related to the data operation on the second memory rank 360_2 is input to the memory device 300, or output from the memory device 300, the memory device 300 may receive the pre-charge command related to the data operation on the second memory rank 360_2. In response to the memory device 300 receiving the pre-charge command related to the data operation on the second memory rank 360_2, the control logic 320 may disable the data clock receiver 330.

Similarly, in an exemplary embodiment of the inventive concept, in the data operation of the rank interleaving method for the first memory rank 360_1 and the second memory rank 360_2, in response to the memory device 300 receiving the active command related to the data operation on the first memory rank 360_1, the control logic 320 may enable the data clock receiver 330. Thereafter, the memory device 300 may perform the data operation on the first memory rank 360_1 and the second memory rank 360_2. Thereafter, in response to the memory device 300 receiving the power-down-entry command, the control logic 320 may disable the data clock receiver 330.

Similarly, in an exemplary embodiment of the inventive concept, in the data operation of the rank interleaving method for the first memory rank 360_1 and the second memory rank 360_2, in response to the memory device 300 receiving the power-down-exit command related to the data operation on the first memory rank 360_1, the control logic 320 may enable the data clock receiver 330. Thereafter, the memory device 300 may perform the data operation on the first memory rank 360_1 and the second memory rank

360_2. Thereafter, in response to the memory device 300 receiving the power-down-entry command, the control logic 320 may disable the data clock receiver 330.

Figure 13:
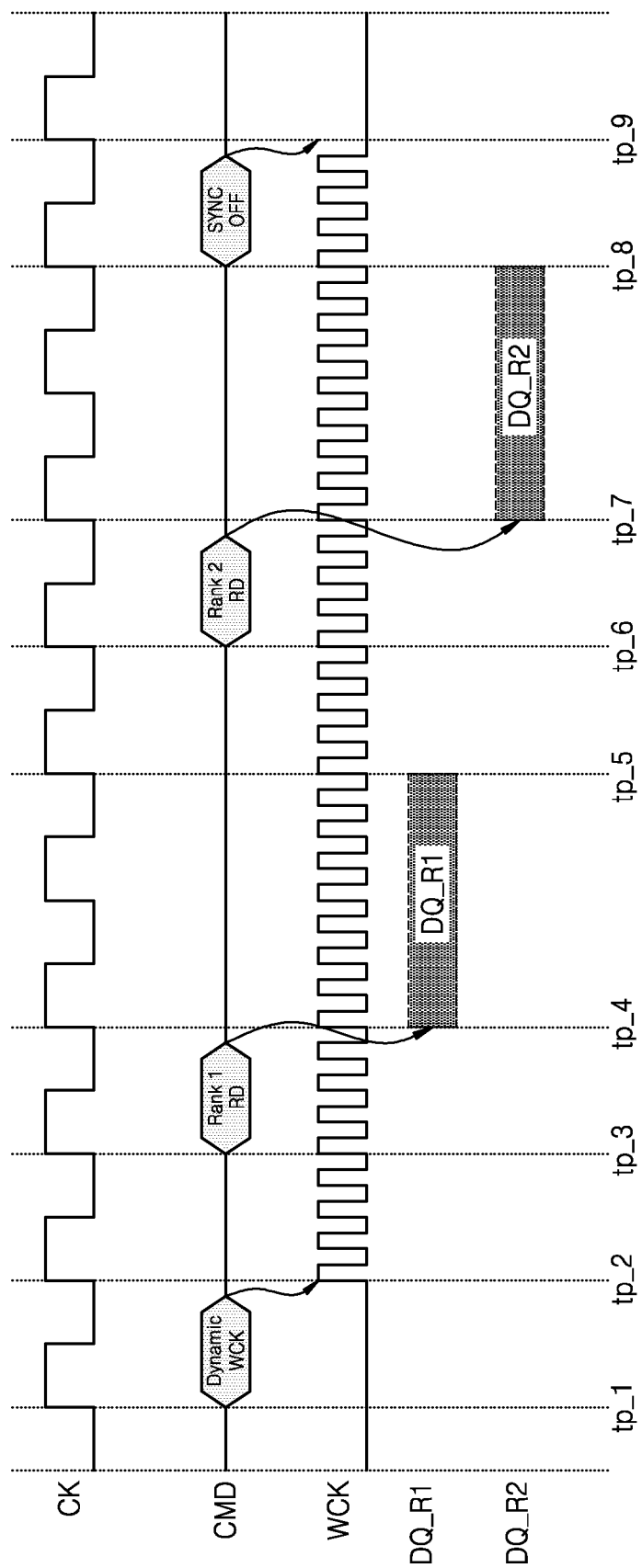
FIG. 13 illustrates a timing diagram of signals of the memory system of FIG. 12, according to an exemplary embodiment of the inventive concept.

FIG. 13 illustrates a timing diagram of signals of FIG. 12, according to an exemplary embodiment of the inventive concept. First time point tp_1 through ninth time point tp_9 illustrated in FIG. 13 may represent time points that are independent of the time points shown in the previous drawings. FIG. 13 is described together with reference to FIG. 12.

The memory device 300 may receive the dynamic WCK command from the memory controller 200 at the first time point tp_1. For example, the memory device 300 may receive the dynamic WCK command via the command pin. The received dynamic WCK command may be provided to the command decoder 310, and the command decoder 310 may generate the control signal DS corresponding to the dynamic WCK command by decoding the dynamic WCK command. Based on the control signal DS corresponding to the dynamic WCK command, the control logic 320 may enable the data clock receiver 330. For example, the control logic 320 may enable the data clock receiver 330 by providing the data clock receiver enable signal WR_EN having the first logic level to the data clock receiver 330.

As the data clock receiver 330 is enabled, the data clock signal WCK may be received by the memory device 300 beginning from the second time point tp_2. FIG. 13 illustrates that the phase of the data clock signal WCK is aligned with the phase of the main clock signal CK immediately after the second time point tp_2, but this is only for convenience of description, and is not limited thereto. For example, during a predetermined time distance from the second time point tp_2, the memory device 300 may perform the synchronization operation to match the phase of the data clock signal WCK to the phase of the main clock signal CK.

The data clock receiver 330 may maintain the enabled state until the sync-off command for directing the end of synchronization between the data clock signal WCK and the main clock signal CK is received by the memory device 300 at the ninth time point tp_9. In other words, the data clock receiver 330 may remain in the enabled state from the second time point tp_2 to the ninth time point tp_9. The data clock receiver 330 may receive the data clock signal WCK while in the enabled state.

The memory device 300 may receive the data operation command for the first memory rank from the memory controller 200 at the third time point tp_3. In the present exemplary embodiment, the data operation command is the read command, but the inventive concept is not limited thereto.

From the fourth time point tp_4 to the fifth time point tp_5, a first data DQ_R1 for the first memory rank 360_1 may be read from the first memory rank 360_1. For example, the first data DQ_R1 may be provided to the memory controller 200 outside the memory device 300 from the first memory rank 360_1 via the data I/O circuit 350.

The memory device 300 may receive the data operation command for the second memory rank 360_2 from the memory controller 200 at the sixth time point tp_6. In the present exemplary embodiment, the data operation command is the read command, but the inventive concept is not limited thereto.

From the seventh time point tp_7 to the eighth time point tp_8, a second data DQ_R2 for the second memory rank 360_2 may be read from the second memory rank 360_2. For example, the second data DQ_R2 may be provided to the memory controller 200 outside the memory device 300 from the second memory rank 360_2 via the data I/O circuit 350.

After the second data DQ_R2 is input or output, the memory device 300 may receive the sync-off command from the memory controller 200. FIG. 13 illustrates that the sync-off command is input at the eighth time point tp_8, but is not limited thereto. For example, the sync-off command may be input at another time point after the eighth time point tp_8.

The received sync-off command may be provided to the command decoder 310, and the command decoder 310 may generate the control signal DS corresponding to the sync-off command by decoding the sync-off command. Based on the control signal DS corresponding to the sync-off command, the control logic 320 may disable the data clock receiver 330. For example, the control logic 320 may disable the data clock receiver 330 by providing the data clock receiver enable signal WR_EN having the second logic level to the data clock receiver 330.

As the data clock receiver 330 is disabled, the data clock signal WCK may not be received by the memory device 300 beginning from the ninth time point tp_9.

The timing diagram of FIG. 13 may be variously modified according to exemplary embodiments of the inventive concept as described with reference to FIGS. 6A through 11.

For example, when the exemplary embodiment of FIGS. 7A and 7B is applied to FIG. 13, the sync-off command may be replaced by the pre-charge command. In this case, the pre-charge command may be the pre-charge command related to the data operation on the second memory rank 360_2.

For example, when the exemplary embodiment of FIGS. 8A and 8B is applied to FIG. 13, the sync-off command may be replaced by the power-down-entry command.

For example, when the exemplary embodiment of FIGS. 9A and 9B is applied to FIG. 13, the dynamic data clock (WCK) command may be replaced by the active command and the sync-off command may be replaced by the pre-charge command. In this case, the active command may be the active command related to the data operation on the first memory rank 360_1, and the pre-charge command may be the pre-charge command related to the data operation on the second memory rank 360_2.

When the exemplary embodiment of FIG. 10 is applied to FIG. 13, the dynamic data clock command may be replaced by the active command and the sync-off command may be replaced by the power-down-entry command. In this case, the active command may be the active command related to the data operation on the first memory rank 360_1.

When the exemplary embodiment of FIG. 11 is applied to FIG. 13, the dynamic data clock command may be replaced by the power-down-exit command and the sync-off command may be replaced by the power-down-entry command.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:
1. A memory device comprising:
a command decoder configured to receive a command;
a data clock receiving circuit configured to receive a data clock signal; and a control logic configured to control the data clock receiving circuit based on the command decoded by the command decoder, and enable the data clock receiving circuit, wherein the control logic enables the data clock receiving circuit in response to the memory device receiving a dynamic data clock command, and the data clock receiving circuit is in an enabled state until a predetermined particular command is received.

2. The memory device of claim 1, wherein the predetermined particular command comprises a sync-off command indicating a termination of synchronization between the data clock signal and a main clock signal.

3. The memory device of claim 2, wherein the control logic is configured to disable the data clock receiving circuit in response to the memory device receiving the sync-off command.

4. The memory device of claim 1, wherein the predetermined particular command comprises a pre-charge command related to a data operation of the memory device.

5. The memory device of claim 4, wherein the control logic is configured to disable the data clock receiving circuit in response to the memory device receiving the pre-charge command.

6. The memory device of claim 1, wherein the predetermined particular command comprises a power-down-entry command indicating entry into a power-down mode of the memory device.

7. The memory device of claim 6, wherein the control logic is configured to disable the data clock receiving circuit in response to the memory device receiving the power-down-entry command.

8. The memory device of claim 1, wherein the data clock receiving circuit comprises a buffer configured to be turned on or turned off by control of the control logic, and to receive the data clock signal.

9. The memory device of claim 8, wherein the control logic is configured to enable the data clock receiving circuit by turning on the buffer through a data clock receiving circuit enable signal having a first logic level, and to disable the data clock receiving circuit by turning off the buffer through the data clock receiving circuit enable signal having a second logic level.

10. An operation method of a memory device, the operation method comprising:
receiving a dynamic data clock command to cause a data clock receiving circuit to be in an enabled state until a predetermined particular command is received;
enabling the data clock receiving circuit in response to the dynamic data clock command;
receiving the predetermined particular command; and
disabling the data clock receiving circuit in response to the predetermined particular command.

11. The operation method of claim 10, wherein the predetermined particular command comprises a sync-off command indicating termination of synchronization between a data clock signal and a main clock signal.

12. The operation method of claim 10, wherein the predetermined particular command comprises a pre-charge command related to a data operation of the memory device.

13. The operation method of claim 12, further comprising:
receiving or transmitting data based on a data clock signal received through the data clock receiving circuit after the data clock receiving circuit is enabled,
wherein the data clock receiving circuit is disabled in response to the predetermined particular command after the receiving or transmitting of the data is completed.

14. The operation method of claim 10, wherein the predetermined particular command comprises a power-down-entry command indicating entry into a power-down mode of the memory device.

15. The operation method of claim 10, wherein the data clock receiving circuit comprises a buffer configured to receive a data clock signal, and
the data clock receiving circuit is disabled by turning off the buffer by a control logic.

16. A memory device comprising:
a plurality of memory ranks comprising a first memory rank and a second memory rank;
a first pin through which a data clock signal is input from outside of the memory device;
a data clock receiving circuit configured to receive the data clock signal input via the first pin;
a second pin through which a command is input from outside of the memory device; and
a control logic configured to control a data operation of the memory device based on the command input via the second pin, enable the data clock receiving circuit based on a first command input via the second pin, control data operations of the first memory rank and the second memory rank during an interval when the data clock receiving circuit is in an enabled state, and disable the data clock receiving circuit based on a second command input via the second pin,
wherein the first command is a command that causes the data clock receiving circuit, after the data clock receiving circuit is enabled, to be maintained in an enabled state until the second command is input via the second pin.

17. The memory device of claim 16, wherein the control logic is configured to control a data operation of the first memory rank and the second memory rank according to a rank interleaving method.

18. The memory device of claim 17, wherein the second command comprises a pre-charge command related to a data operation of the second memory rank.

19. The memory device of claim 16, wherein the second command comprises a sync-off command directing a termination of synchronization between the data clock signal and a main clock signal.

20. The memory device of claim 16, wherein the second command comprises a power-down-entry command indicating entry into a power-down mode of the memory device.

* * * * *